(12) United States Patent  (10) Patent No.: US 8,693,556 B2
Ware et al.  (45) Date of Patent: *Apr. 8, 2014

(54) COMMUNICATION CHANNEL CALIBRATION FOR DRIFT CONDITIONS

(71) Applicant: Rambus Inc., Sunnyvale, CA (US)

(72) Inventors: Frederick A. Ware, Los Altos Hills, CA (US); Richard E. Perego, Thornton, CO (US); Craig E. Hampel, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/846,413

(22) Filed: Mar. 18, 2013

(65) Prior Publication Data

US 2013/0230122 A1 Sep. 5, 2013

Related U.S. Application Data

(63) Continuation of application No. 13/409,534, filed on Mar. 1, 2012, now Pat. No. 8,422,568, which is a continuation of application No. 11/754,102, filed on May 25, 2007, now Pat. No. 8,144,792, which is a continuation of application No. 11/459,294, filed on Jul. 21, 2006, now Pat. No. 7,415,073, which is a continuation of application No. 10/766,765, filed on Jan. 28, 2004, now Pat. No. 7,095,789.

(51) Int. Cl.
*H04L 25/00* (2006.01)

(52) U.S. Cl.
USPC .......................................... 375/257

(58) Field of Classification Search
USPC ......... 375/257, 130, 219, 222, 224, 295, 316; 714/719, 721
See application file for complete search history.

(56) References Cited

U.S. PATENT DOCUMENTS

| 3,115,102 A | 12/1963 | Rolfe et al. |
| 3,155,102 A | 11/1964 | Niederer, Jr. et al. |
| 3,638,121 A | 1/1972 | Spilker, Jr. |

(Continued)

FOREIGN PATENT DOCUMENTS

JP  2000-035831 A2  2/2000

OTHER PUBLICATIONS

"Draft Standard for a High-Speed Memory Interface (SyncLink)," Draft 0.99 IEEE P1596.7-199X, pp. 1-56 (1996), Microprocessor and Microcomputer Standards Subcommittee of the IEEE Computer Society. 66 pages.

(Continued)

*Primary Examiner* — Khai Tran

(57) ABSTRACT

A method and system provides for execution of calibration cycles from time to time during normal operation of the communication channel. A calibration cycle includes de-coupling the normal data source from the transmitter and supplying a calibration pattern in its place. The calibration pattern is received from the communication link using the receiver on the second component. A calibrated value of a parameter of the communication channel is determined in response to the received calibration pattern. The steps involved in calibration cycles can be reordered to account for utilization patterns of the communication channel. For bidirectional links, calibration cycles are executed which include the step of storing received calibration patterns on the second component, and retransmitting such calibration patterns back to the first component for use in adjusting parameters of the channel at first component.

18 Claims, 19 Drawing Sheets

(56) References Cited

U.S. PATENT DOCUMENTS

| | | |
|---|---|---|
| 3,922,491 A | 11/1975 | Bjork et al. |
| 4,384,354 A | 5/1983 | Crawford et al. |
| 4,648,133 A | 3/1987 | Vilnrotter |
| 5,111,208 A | 5/1992 | Lopez |
| 5,122,978 A | 6/1992 | Merrill |
| 5,243,626 A | 9/1993 | Devon et al. |
| 5,436,908 A | 7/1995 | Fluker et al. |
| 5,485,490 A | 1/1996 | Leung et al. |
| 5,511,091 A | 4/1996 | Saito |
| 5,523,760 A | 6/1996 | McEwan |
| 5,548,146 A | 8/1996 | Kuroda et al. |
| 5,554,945 A | 9/1996 | Lee et al. |
| 5,621,913 A | 4/1997 | Tuttle et al. |
| 5,742,798 A | 4/1998 | Goldrian |
| 5,859,881 A | 1/1999 | Ferraiolo et al. |
| 6,047,346 A | 4/2000 | Lau et al. |
| 6,163,570 A | 12/2000 | Olafsson |
| 6,173,345 B1 | 1/2001 | Stevens |
| 6,219,384 B1 | 4/2001 | Kliza et al. |
| 6,282,210 B1 | 8/2001 | Rapport et al. |
| 6,321,282 B1 | 11/2001 | Horowitz et al. |
| 6,359,931 B1 | 3/2002 | Perino et al. |
| 6,369,652 B1 | 4/2002 | Nguyen et al. |
| 6,374,375 B1 | 4/2002 | Yip et al. |
| 6,377,640 B2 | 4/2002 | Trans |
| 6,396,329 B1 | 5/2002 | Zerbe |
| 6,421,389 B1 | 7/2002 | Jett et al. |
| 6,434,081 B1 | 8/2002 | Johnson et al. |
| 6,442,644 B1 | 8/2002 | Gustavson et al. |
| 6,448,815 B1 | 9/2002 | Talbot et al. |
| 6,463,392 B1 | 10/2002 | Nygaard et al. |
| 6,469,555 B1 | 10/2002 | Lau et al. |
| 6,473,439 B1 | 10/2002 | Zerbe et al. |
| 6,484,232 B2 | 11/2002 | Olarig et al. |
| 6,496,911 B1 | 12/2002 | Dixon et al. |
| 6,510,503 B2 | 1/2003 | Gillingham et al. |
| 6,539,072 B1 | 3/2003 | Donnelly et al. |
| 6,556,934 B2 | 4/2003 | Higashide |
| 6,560,716 B1 | 5/2003 | Gasparik et al. |
| 6,606,041 B1 | 8/2003 | Johnson |
| 6,606,350 B2 | 8/2003 | Dress, Jr. et al. |
| 6,606,576 B2 | 8/2003 | Sessions |
| 6,643,787 B1 | 11/2003 | Zerbe et al. |
| 6,657,468 B1 | 12/2003 | Best et al. |
| 6,662,305 B1 | 12/2003 | Salmon et al. |
| 6,690,741 B1 | 2/2004 | Larrick, Jr. et al. |
| 6,717,992 B2 | 4/2004 | Cowie et al. |
| 6,735,709 B1 | 5/2004 | Lee et al. |
| 6,889,357 B1 | 5/2005 | Keeth et al. |
| 6,920,540 B2 | 7/2005 | Hampel et al. |
| 7,095,789 B2 | 8/2006 | Ware et al. |
| 7,099,424 B1 | 8/2006 | Chang et al. |
| 7,175,940 B2 | 2/2007 | Laidig et al. |
| 8,144,792 B2 | 3/2012 | Ware et al. |
| 2001/0048382 A1 | 12/2001 | Low et al. |
| 2001/0053175 A1 | 12/2001 | Hoctor et al. |
| 2001/0056332 A1 | 12/2001 | Abrosimov et al. |
| 2002/0054648 A1 | 5/2002 | Krummrich et al. |
| 2002/0072870 A1 | 6/2002 | Adam et al. |
| 2002/0138224 A1 | 9/2002 | Sessions |
| 2002/0149824 A1 | 10/2002 | Beaulieu et al. |
| 2003/0026399 A1 | 2/2003 | Carlson |
| 2003/0063597 A1 | 4/2003 | Suzuki |
| 2003/0087659 A1 | 5/2003 | Wang |
| 2003/0117864 A1 | 6/2003 | Hampel et al. |
| 2003/0146800 A1 | 8/2003 | Dvorak |
| 2003/0149991 A1 | 8/2003 | Reidhead et al. |
| 2003/0198212 A1 | 10/2003 | Hoctor et al. |
| 2003/0198308 A1 | 10/2003 | Hoctor et al. |
| 2004/0032354 A1 | 2/2004 | Knobel et al. |
| 2004/0057500 A1 | 3/2004 | Balachandran et al. |
| 2004/0077327 A1 | 4/2004 | Lim et al. |
| 2004/0083070 A1 | 4/2004 | Salmon et al. |
| 2004/0217881 A1 | 11/2004 | Pedyash et al. |
| 2005/0028050 A1 | 2/2005 | Ganry |
| 2005/0163202 A1* | 7/2005 | Hampel et al. ............... 375/219 |

OTHER PUBLICATIONS

Banu, Mihai, et al., "TA 6.4: A 660Mb/s CMOS Clock Recovery Circuit with Instantaneous Locking for NRZ Data and Burst-Mode Transmission," IEEE International Solid State Circuits Conference, 1993, pp. 102-103, 270.

Cerisola, M. et al., "CORD—a WDM Optical Network: Control Mechanism Using Subcarrier Multiplexing and Novel Synchronization Solutions," Communications, 1995. ICC 95 Seattle, Gateway to Globalization, 1995 IEEE International Conference on, vol. 1, Jun. 18-22, 1995, pp. 261-265 vol. 1.

Chang et al., "A 2 Gb/s Asymmetric Serial Link for High-Bandwidth Packet Switches," Hot Interconnects V, Stanford University, Aug. 1997, pp. 1-9.

Chang, Kun-Yung, "Design of a CMOS Asymmetric Serial Link," A Dissertation Submitted to the Department of Electrical Engineering and the Committee on Graduate Studies of Stanford University, Aug. 1999. 133 pages.

Chen et al., "A 1.25Gb/s, 460mW CMOS Transceiver for Serial Data Communication," ISSCC97, Session 15, Serial Data Communications, Paper FP 15.3, pp. 242-243, 465, Feb. 7, 1997. 3 pages.

Dally et al., "Transmitter Equalization for 4-Gbps Signaling," IEEE Micro, vol. 17, No. 1, Jan./Feb. 1997, pp. 48-56. 9 pages.

Dally, W.J., et al., "Digital Systems Engineering," Cambridge University Press, 1998, pp. 447-449.

Daniele, N. et al., "Principle and Motivations of UWB Technology for High Data Rate WPAN Applications," SOC 2003, 4 pages.

Daniele, Norbert, "Ultra Wide Band Principles and Applications for Wireless Communications," CEA-LETI Annual Review, Jun. 25 and 26, 2002, 23 pages.

Eldering et al., "Digital Burst Mode Clock Recovery Technique for Fiber-Optic Systems," Journal of Lightwave Technology, vol. 12, No. 2, Feb. 1994, pp. 271-279.

EP Invitation, Official Communication dated May 4, 2011 re EP Application No. 05711973.7. 2 Pages.

EP Office Action dated Nov. 24, 2011 re EP Application No. 05711973.7. 1 Page.

EP Response dated Jan. 9, 2012 to the Official Communication dated Nov. 24, 2011 and to the Supplementary EP Search Report dated Nov. 7, 2011 re EP Application 05711973.7. 1 page.

EP Response dated Jun. 29, 2011 to the Official Communication dated May 4, 2011 re EP Application No. 05711973.7. 1 Page.

EP Supplementary Partial European Search Report dated Nov. 7, 2011 re EP Application No. 05711973.7. 5 Pages.

First CN Office Action dated May 4, 2012 for CN Application No. 200910205259.9. 24 pages.

Gillingham et al., "SLDRAM: High Performance Open-Standard Memory," IEEE Micro, Nov./Dec. 1997, pp. 29-39, vol. 17, No. 6, Institute of Electrical and Electronics Engineers, Inc., Los Alamitos, California. 11 pages.

Gillingham, Peter, "SLDRAM Architectural and Functional Overview," SLDRAM Consortium, Aug. 29, 1997, pp. 1-14. 14 pages.

Hu, Timothy H., et al., "A Monolithic 480 Mb/s Parallel AGC/Decision/Clock-Recovery Circuit in 1.2-um CMOS," IEEE Journal of Solid-State Circuits, vol. 28, No. 12, Dec. 1993, pp. 1314-1320.

Intel "How to Measure RDRAM System Clock Jitter" Application Note AP-667 (Jun. 1999), pp. 1-15.

Kim, Sungjoon et al., "An 800Mbps Multi-Channel CMOS Serial Link with 3x Oversampling," IEEE 1995 Custom Integrated Circuits Conference, pp. 22.7.1-22.7.4.

Lee, Ming-Ju Edward et al., "TP 15.3: A 90mW 4Gb/s Equalized I/O Circuit with Input Offset Cancellation," IEEE International Solid-State Circuits Conference, pp. 252-253, Feb. 8, 2000. 2 pages.

Lewis, Dave, "Easy-to-Use LVDS Serdes for the Serdes Neophyte," National Semiconductor, Jun. 16, 2003, 5 pages.

Nakamura, Kazuyuki, et al., "A 6 Gbps CMOS Phase Detecting DEMUX Module Using Half-Frequency Clock," 1998 Symposium on VLSI Circuits Digest of Technical Papers, pp. 196-197.

(56) References Cited

OTHER PUBLICATIONS

Nakase et al., "Source-Synchronization and Timing Vernier Techniques for 1.2 GB/s SLDRAM Interface," IEEE Journal of Solid-State Circuits, vol. 34, No. 4, Apr. 1999, pp. 494-501. 8 pages.
Office Action dated Apr. 20, 2011 re U.S. Appl. No. 11/754,102 Notice of References Cited and Information Disclosure Statement. 13 Pages.
Paris et al., "WP 24.3: A 800 Mb/s 72 Mb SLDRAM with Digitally-Calibrated DLL," ISSCC, 0-7803-5129-0/99, Slide Supplement, IEEE, 1999. 10 pages.
Poulton, John et al., "A Tracking Clock Recovery Receiver for 4Gb/s Signaling," Hot Interconnects '97, Aug. 21-23, 1997, Palo Alto, CA, pp. 1-13. 14 pages.
Rambus "Direct Rambus Long Channel Design Guide" (2000). 48 pages.
Rambus "Direct Rambus Short Channel Layout Guide, Version 0.95" (Aug. 2001), 52 pages.
Rambus, Inc. "RDRAM Direct Rambus Clock Generator," (Apr. 2002), 22 pages.
RaSer™ X Product Brief, "Highly Flexible 10 Gbps Backplane Serial Link Interface," Copyright 2003 Rambus, Inc., all rights reserved, 2 pages.
RDRAM® Overview, "High Performance Memory Interface Solution," Copyright 2003 Rambus, Inc., all rights reserved, 4 pages.
Redwood Technology Brief, "High Performance Parallel Bus Interface Technology," Copyright 2003 Rambus, Inc., all rights reserved, 2 pages.
Response dated Jul. 11, 2011 to the Office Action mailed Apr. 20, 2011 re U.S. Appl. No. 11/754,102. 16 Pages.
SLDRAM Inc., "SLD4M18DR400 4 Meg X 18 SLDRAM: 400 Mb/s/pin SLDRAM 4 M×18 SLDRAM Pipelined, Eight Bank, 2.5 V Operation," Jul. 9, 1998, pp. 1-69, SLDRAM, Inc. San Jose, California. 69 pages.
TW Office Action and IPO Search Report with search completion date of Jun. 9, 2012 re TW Application No. 094101309. 12 pages.
Ware, Frederick, U.S. Appl. No. 11/754,102, filed May 25, 2007, re Notice of Allowance and Fee(s) Due mailed Sep. 13, 2011. 8 pages.
Ware, Frederick, U.S. Appl. No. 11/754,102, filed May 25, 2007, Notice of Allowance and Fee(s) Due mailed Jan. 9, 2012. 11 pages.
Widmer et al., "Single-Chip 4×500-MBd CMOS Transceiver," IEEE Journal of Solid-State Circuits, vol. 31, No. 12, Dec. 1996, pp. 2004-2014. 11 pages.
Widmer, et al., "A DC-Balanced, Partitioned-Block, 8B/10B Transmission Code," IBM J. Res. Develop., vol. 27, No. 5, Sep. 1983, pp. 440-451. 12 pages.
Win, Moe Z. et al., "Impulse Radio: How It Works," IEEE Communications Letters 2(2), Feb. 1998, pp. 36-38.
Yang, Chih-Kong Ken "Design of High-Speed Serial Links in CMOS," Technical Report No. CSL-TR-98-775, Sponsored by Center for Integrated Systems, Sun Microsystems and LSI Logic Inc. Dec. 1998, pp. 1-182.
Yellowstone Technology Brief, "High Performance Memory Interface Technology," Copyright 2003 Rambus, Inc., all rights reserved, 2 pages.
Zerbe, Jared et al., U.S. Appl. No. 09/776,550, filed Feb. 2, 2001, entitled "Method and Apparatus for Evaluating and Calibrating a Signaling System." 62 pages.
Zerbe, Jared et al., U.S. Appl. No. 09/976,170, filed Oct. 21, 2001, entitled "Method and Apparatus for Evaluating and Optimizing a Signaling System." 98 pages.

* cited by examiner

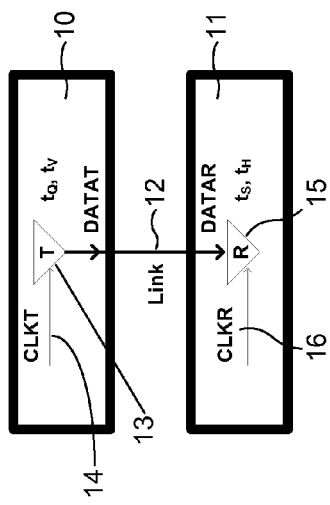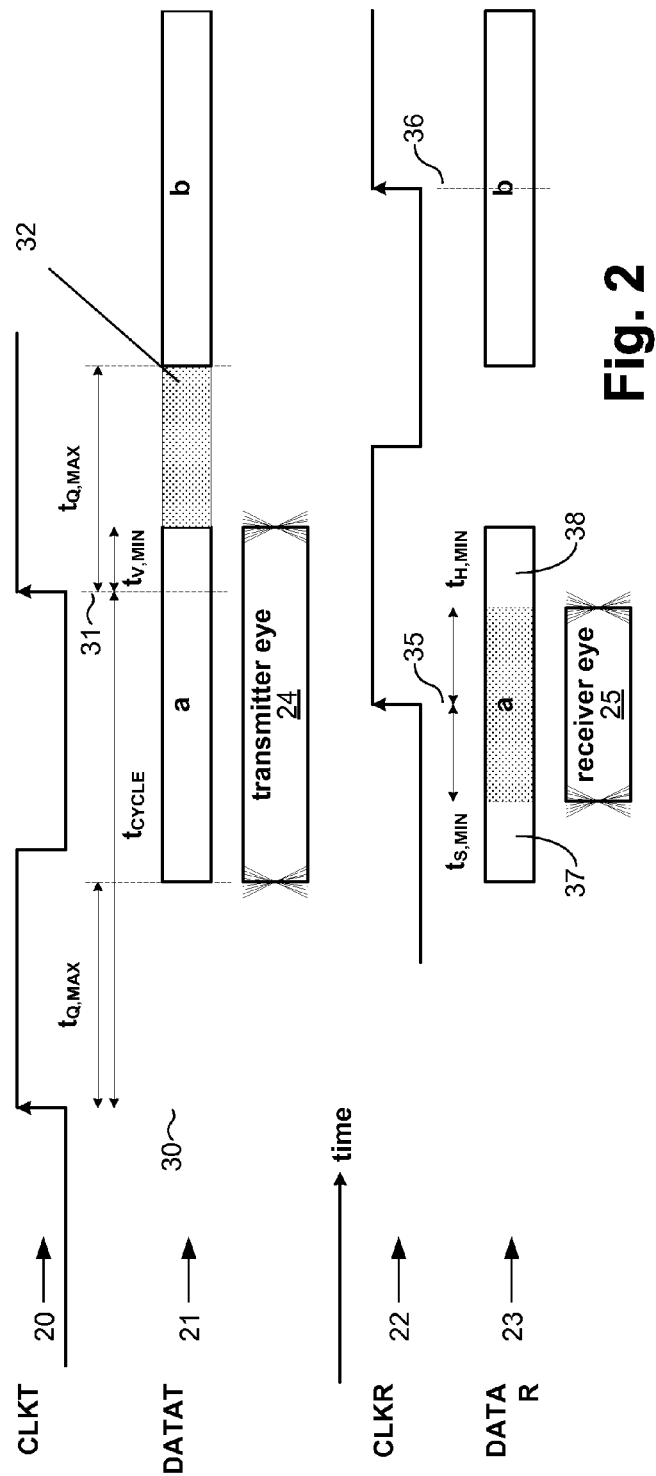

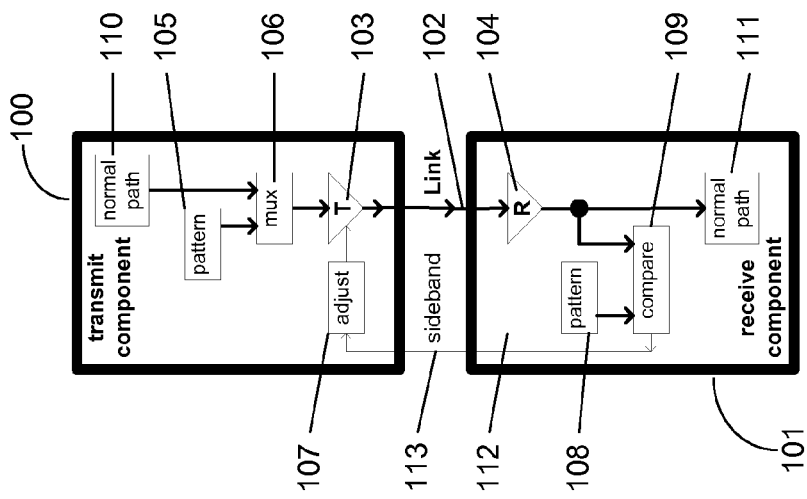
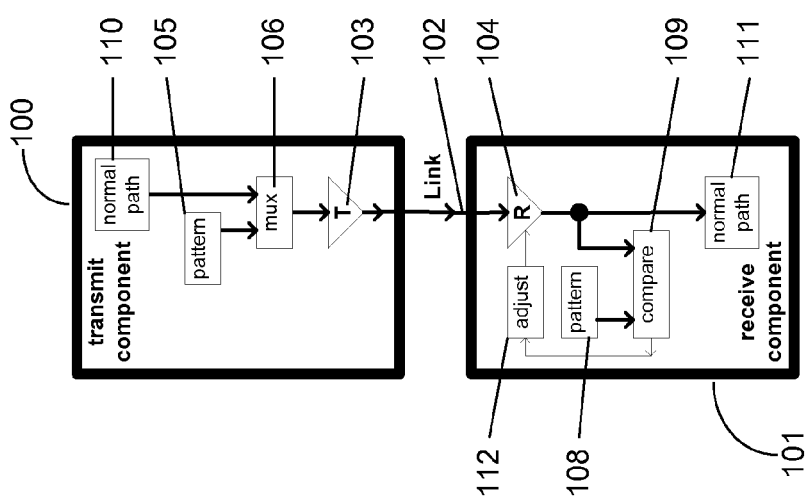
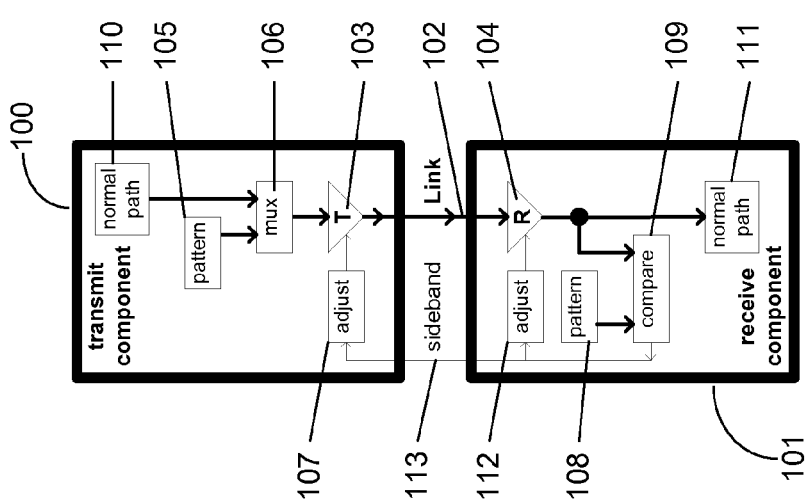
Fig. 5
Fig. 4
Fig. 3

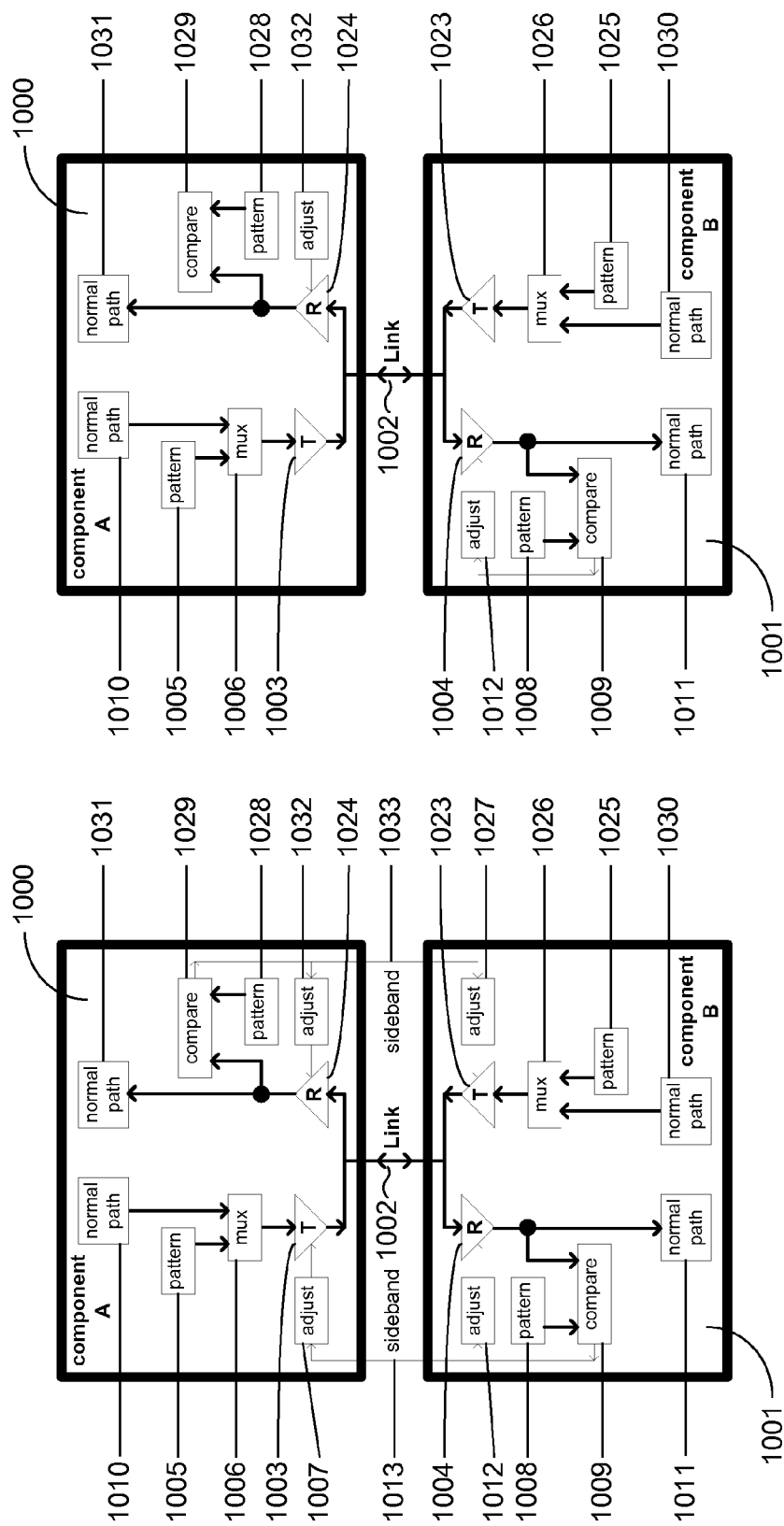

COMMUNICATION CHANNEL CALIBRATION FOR DRIFT CONDITIONS

CROSS REFERENCE TO RELATED APPLICATIONS

The present application is a continuation of co-pending U.S. patent application Ser. No. 13/409,534, filed 1 Mar. 2012, entitled COMMUNICATION CHANNEL CALIBRATION FOR DRIFT CONDITIONS, which application is a continuation of application Ser. No. 11/754,102, filed 25 May 2007, entitled COMMUNICATION CHANNEL CALIBRATION FOR DRIFT CONDITIONS (now U.S. Pat. No. 8,144, 792), which application is a continuation of application Ser. No. 11/459,294, filed 21 Jul. 2006, entitled COMMUNICATION CHANNEL CALIBRATION FOR DRIFT CONDITIONS (now U.S. Pat. No. 7,415,073); which is a continuation of U.S. patent application Ser. No. 10/766,765, filed 28 Jan. 2004, entitled COMMUNICATION CHANNEL CALIBRATION FOR DRIFT CONDITIONS, now U.S. Pat. No. 7,095,789; which prior applications are incorporated herein by reference.

BACKGROUND OF THE INVENTION

1. Field of the Invention

The present invention relates to the calibration of communication channel parameters in systems, including mesochronous systems, in which two (or more) components communicate via an interconnection link; and to the calibration needed to account for drift of conditions related to such parameters during operation of the communication channels.

2. Description of Related Art

In high-speed communication channels which are operated in a mesochronous manner, typically a reference clock provides frequency and phase information to the two components at either end of the link. A transmitter on one component and a receiver on another component each connect to the link. The transmitter and receiver operate in different clock domains, which have an arbitrary (but fixed) phase relationship to the reference clock. The phase relationship between transmitter and receiver is chosen so that the propagation delay seen by a signal wavefront passing from the transmitter to the receiver will not contribute to the timing budget when the signaling rate is determined. Instead, the signaling rate will be determined primarily by the drive window of the transmitter and the sample window of the receiver. The signaling rate will also be affected by a variety of second order effects. This system is clocked in a mesochronous fashion, with the components locked to specific phases relative to the reference clock, and with the drive-timing-point and sample-timing-point of each link fixed to the phase values that maximize the signaling rate.

These fixed phase values may be determined in a number of ways. A sideband link may accompany a data link (or links), permitting phase information to be passed between transmitter and receiver. Alternatively, an initialization process may be invoked when the system is first given power, and the proper phase values determined by passing calibration information (patterns) across the actual link. Once the drive-timing-point and sample-timing-point of each link has been fixed, the system is permitted to start normal operations.

However, during normal operation, system conditions will change. Ambient temperature, component temperature, supply voltages, and reference voltages will drift from their initial values. Clock frequencies may drift due to environmental and operational factors, or be intentionally caused to drift in spread spectrum clock systems, and the like. Typically, the frequency drift will be constrained to lie within a specified range, and many of the circuits in the components will be designed to be insensitive to the drift. Nonetheless, the drift will need to be considered when setting the upper signaling rate of a link. In general, a channel parameter may be calibrated as a function of one or more changing operating conditions or programmed settings. In many cases, drifting parameters will be plotted in the form of a two-dimensional Schmoo plot for analysis. Examples of programmed settings, which might be subject of calibration, or which might cause drift in other channel parameters, include transmitter amplitude, transmitter drive strength, transmitter common-mode offset, receiver voltage reference, receiver common-mode offset, and line termination values.

As the conditions drift or change, the optimal timing points of the transmitter and receiver will change. If the timing points remain at their original values, then margin must be added to the timing windows to ensure reliable operation. This margin will reduce the signaling rate of the link.

It is desirable to provide techniques to compensate for the condition drift, and provide improvements in system and component design to permit these techniques to be utilized.

SUMMARY OF THE INVENTION

The present invention provides a system and method for calibrating a communication channel, which allows for optimizing timing windows and accounting for drift of properties of the channel. A communication channel includes a first component having a transmitter coupled to a normal data source, and at least a second component having a receiver coupled to a normal signal destination. A communication link couples the first and second components, and other components on the link. The present invention includes a method and system that provides for execution of calibration cycles from time to time during normal operation of the communication channel. A calibration cycle includes de-coupling the normal data source from the transmitter and supplying a calibration pattern in its place. The calibration pattern is transmitted on the link using the transmitter on the first component. After transmitting the calibration pattern, the normal data source is re-coupled to the transmitter. The calibration pattern is received from the communication link using the receiver on the second component. A calibrated value of a parameter of the communication channel is determined in response to the received calibration pattern. In some embodiments of the invention, the communication channel is bidirectional, so that the first component includes both a transmitter and a receiver, and second component likewise includes both a transmitter and receiver.

The communication channel transmits data using the transmitter on the first component and receives data using the receiver on the second component with a first parameter of the communication channel, such as one of a receive and transmit timing point for the transmissions from the first to the second component, set to an operation value, and receives data using the receiver on the first component and transmits data using the transmitter on the second component with a second parameter of the communication channel, such as one of a receive and transmit timing point for the transmissions from the second to the first component, set to an operation value.

According to one embodiment of the invention, a method comprises:

storing a value of a first edge parameter and a value of a second edge parameter, wherein an operation value of said parameter of the communication channel is a function of the first and second edge parameters;
executing a calibration cycle;
the calibration cycle including iteratively adjusting the value of the first edge parameter, transmitting a calibration pattern using the transmitter on the first component, receiving the calibration pattern using the receiver on the second component, and comparing the received calibration pattern with a stored calibration pattern, to determine an updated value for the first edge value;
the calibration cycle also including iteratively adjusting the value of the second edge parameter, transmitting a calibration pattern using the transmitter on the first component, receiving the calibration pattern using the receiver on the second component, and comparing the received calibration pattern with a stored calibration pattern, to determine an updated value for the second edge value; and
as a result of the calibration cycle, determining a new operation value for the parameter based on the function of the updated values of the first and second edge parameters.

Some embodiments of the invention comprise a calibration method comprising:
executing a calibration cycle including transmitting a calibration pattern using the transmitter on the first component and receiving the calibration pattern using the receiver on the second component with the first parameter set to a calibration value, and determining a calibrated value of the first parameter in response to the received calibration pattern; and
prior to determining said calibrated value of said calibration cycle, transmitting data using the transmitter on the second component and receiving the data using the receiver on the first component with the second parameter set to the operation value.

Methods according to some embodiments of the invention comprise executing calibration cycles from time to time, the calibration cycles comprising:
de-coupling the data source from the transmitter;
adjusting the parameter to a calibration value;
supplying a calibration pattern to the transmitter;
transmitting the calibration pattern on the communication link using the transmitter on the first component;
receiving the calibration pattern on the communication link using the receiver on the second component;
re-coupling the data source to the transmitter and setting the parameter to the operation value; and
determining a calibrated value of the parameter of the communication channel in response to the received calibration pattern, wherein said re-coupling occurs prior to said determining.

A variety of parameters of the communication channel can be calibrated according to the present invention. In some embodiments, the parameter being calibrated is a transmit timing point for the transmitter of the first component. In some embodiments, the parameter being calibrated is a receive timing point for the receiver of the second component. In yet other embodiments including bidirectional links, the parameter being calibrated is a receive timing point for the receiver of the first component. Also, embodiments of the present invention including bidirectional links provide for calibration of both receive timing points and transmit timing points for the receiver and transmitter respectively of the first component.

In some embodiments that include bidirectional links, calibration cycles are executed which include a step of storing received calibration patterns on the second component, and retransmitting such calibration patterns back to logic on the first component for use in calibrating receive or transmit timing points in the first component. In these embodiments, the second component provides storage for holding the received calibration patterns for a time period long enough to allow the first component to complete transmission of a complete calibration pattern, or at least a complete segment of a calibration pattern. The storage can be embodied by special-purpose memory coupled with the receiver on the second component, or it can be provided by management of memory space used by the normal destination on the second component. For example, the second component comprises an integrated circuit memory device in some embodiments, where the memory device includes addressable memory space. The storage provided for use by the calibration cycles is allocated from addressable memory space in the memory device in these embodiments. In yet other embodiments, where the second component includes latch type sense amplifiers associated with memory on the component, calibration patterns may be stored in the latch type sense amplifiers while decoupling the sense amplifiers from the normally addressable memory space. In yet other embodiments, in which the second component comprises an integrated circuit memory having addressable memory space within a memory array, a segment of the memory array outside of the normally addressable memory space is allocated for use by the calibration cycles.

In yet other embodiments, utilization of memory at the second component can be improved by providing cache memory or temporary memory on the first component. In such embodiments, accesses to the memory array in the second component attempted during a calibration cycle are directed to a cache memory on the first component. In other embodiments, prior to execution of the calibration cycle, a segment of the addressable memory in the second component to be used for storage of the calibration pattern is copied into temporary storage on the first component for use during the calibration cycle.

In systems and methods according to the present invention, parameters which are updated by the calibration process are applied to the communication channel so that drift in properties of the communication channel can be tracked to improve reliability and increase operating frequency of the channel. In various embodiments of the calibration process, the steps involved in calibration cycles are reordered to account for utilization patterns of the communication channel. For low latency processes, for example the step of applying the updated parameter is delayed, so that normal transmit and receive processes can be resumed as soon as the calibration pattern has been transmitted, and without waiting for computation of updated parameters. For example, the updated parameter calculated during one calibration cycle is not applied to the communication channel, until a next calibration cycle is executed. In yet another example, the calibration cycle includes a first segment in which calibration patterns are transmitted, and a second segment in which updated parameters calculated during the calibration cycle are applied, so that the time interval between completion of transmission of the calibration pattern and completion of the calculation of the updated parameters is utilized for normal transmission and receive operations.

Other aspects and advantages of the present invention can be seen on review of the drawings, the detailed description and the claims, which follow.

BRIEF DESCRIPTION OF THE DRAWINGS

FIG. 1 is a simplified diagram of two components interconnected by a communication channel.

FIG. 2 is a timing diagram illustrating timing parameters for a communication channel like that shown in FIG. 1.

FIG. 3 illustrates an embodiment of the present invention where both a transmitter drive point and a receiver sample point are adjustable.

FIG. 4 illustrates an embodiment of the present invention where only a receiver sample point is adjustable.

FIG. 5 illustrates an embodiment of the present invention where only a transmitter drive point is adjustable.

FIG. 10 illustrates an embodiment of the present invention where transmitter drive points and receiver sample points on components of a bidirectional link are adjustable.

FIG. 11 illustrates an embodiment of the present invention where receiver sample points on components of a bidirectional link are adjustable.

DETAILED DESCRIPTION

Figure 6:
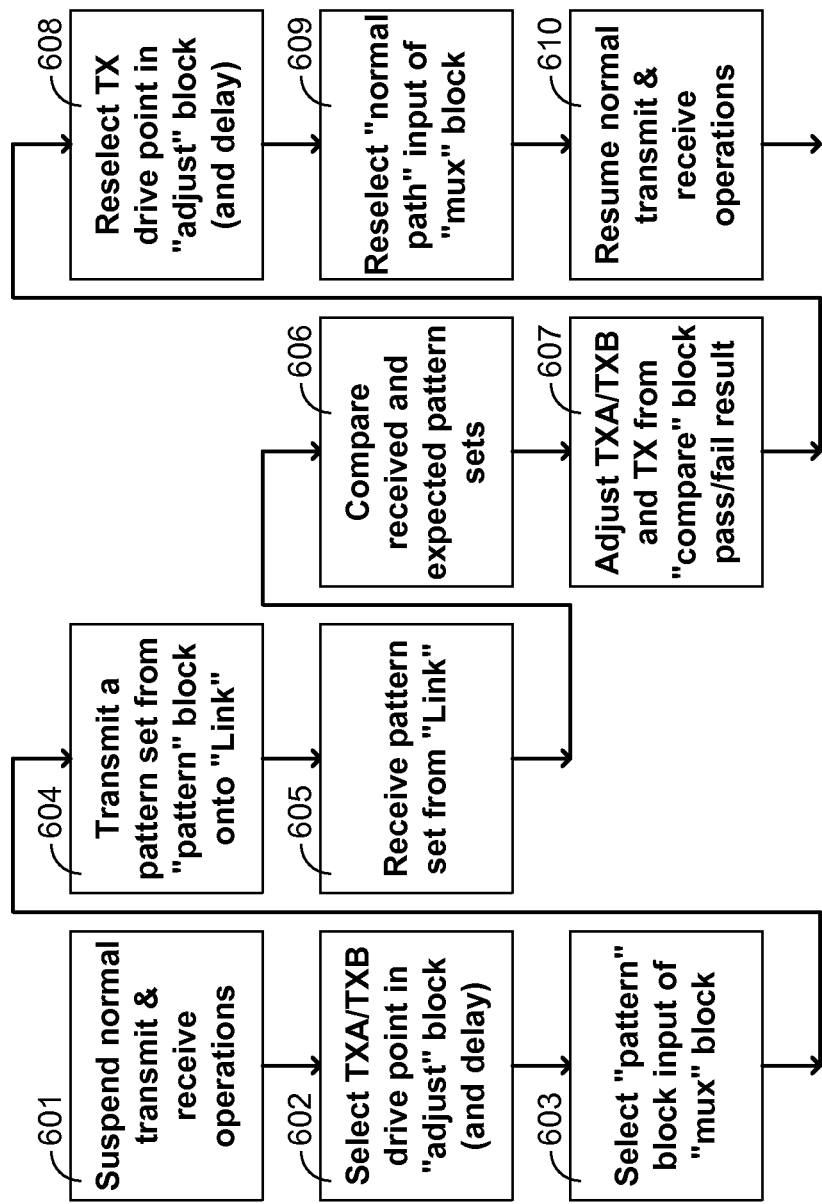
FIG. 6 is a flow chart illustrating calibration steps for a transmitter on a unidirectional link for a transmitter drive point.

A detailed description of embodiments of the present invention is provided with reference to the Figures.

Transmitter and Receiver Timing Parameters

FIG. 1 shows two components 10, 11 connected with an interconnection medium, referred to as Link 12. One has a transmitter circuit 13 which drives symbols (bits) on Link 12 in response to rising-edge timing events on the internal CLKT signal 14. This series of bits forms signal DATAT. The other has a receiver circuit 15 which samples symbols (bits) on Link 12 in response to rising-edge timing events on the internal CLKR signal 16. This series of bits forms signal DATAR. FIG. 2 illustrates the timing parameters, including the transmit clock CLKT signal 14 on trace 20, the transmitter signal DATAT on trace 21, the receive clock CLKR signal 16 on trace 22, and the receiver signal DATAR on trace 23. The transmitter eye 24 and the receiver eye 25 are also illustrated. The transmitter eye 24 is a window during which the signal DATAT is transmitted on the link. The receiver eye is a sampling window defined by the $t_S$ setup time and $t_H$ hold time which surround the CLKR rising edge 35, 36 and define the region in which the value of DATAR must be stable for reliable sampling. Since the valid window of the DATAT signal is larger than this setup/hold sampling window labeled receiver eye 25, the receiver has timing margin in both directions.

The DATAT and DATAR signals are related; DATAR is an attenuated, time-delayed copy of DATAT. The attenuation and time-delay occur as the signal wavefronts propagate along the interconnection medium of Link 12.

The transmitter circuit 13 will begin driving a bit (labeled "a") no later than a time $t_{Q,MAX}$ after a rising edge 30 of CLKT, and will continue to drive it during transmitter eye 24 until at least a time $t_{V,MIN}$ after the next rising edge 31. $t_{Q,Max}$ and $t_{V,MIN}$ are the primary timing parameters of the transmitter circuit 13. These two values are specified across the full range of operating conditions and processing conditions of the communication channel. As a result, $t_{Q,MAX}$ will be larger than $t_{V,MIN}$, and the difference will represent the dead time or dead band 32 of the transmitter circuit 13. The transmitter dead band 32 ($t_{DEAD,T}$) is the portion of the bit timing window (also called bit time or bit window) that is consumed by the transmitter circuit 13:

$$t_{DEAD,T} = t_{Q,MAX} - t_{V,MIN}$$

The receiver circuit 15 will sample a bit (labeled "a") during the receiver eye 25 no earlier than a time $t_{S,MIN}$ before a rising edge 35 of CLKR, and no later than a time $t_{H,MIN}$ after the rising edge 35. $t_{S,MIN}$ and $t_{H,MIN}$ are the primary timing parameters of the receiver circuit. These two values are specified across the full range of operating conditions and processing conditions of the circuit. The sum of $t_{S,MIN}$ and $t_{H,MIN}$ will represent the dead time or dead band 37, 38 of the receiver. The receiver dead band 37, 38 ($t_{DEAD,R}$) is the portion of the bit timing window (also called bit time or bit window) that is consumed by the receiver circuit:

$$t_{DEAD,R} = t_{S,MIN} + t_{H,MIN}$$

In this example, the bit timing window (receiver eye 25) is one $t_{CYCLE}$ minus the $t_{DEAD,T}$ and $t_{DEAD,R}$ values, each of which is about ⅓ of one $t_{CYCLE}$ in this example.

Unidirectional Link Alternatives

FIG. 3 shows two components 100 (transmit component) and 101 (receive component) connected with an interconnection medium referred to as Link 102. The link is assumed to carry signals in one direction only (unidirectional), so one component 100 has a transmitter circuit 103 coupled to a data source 110 labeled "normal path," and one component 101 has a receiver circuit 104 coupled to a destination 111 labeled "normal path". There are additional circuits present to permit periodic adjustment of the drive point and sample point in between periods of normal system operation. These adjustments compensate for changes in the system operating conditions.

The transmitter component includes a block 105 labeled "pattern", which can consist of pattern storage or pattern generation circuitry, and which is used as a source of transmit calibration patterns. A multiplexer block 106 labeled "mux," implemented for example using a logical layer (by which the normal data path may act as a source of calibration patterns and, for example, a virtual switch is implemented by time multiplexing normal data and calibration patterns) or physical layer switch, enables the transmit calibration pattern set to be driven onto the link by the transmitter circuit. The transmitter drive point can be adjusted by the block 107 labeled "adjust". A sideband communication channel 113 is shown coupled between the component 101 and the component 100, by which the results of analysis of received calibration patterns at the component 101 are supplied to the adjust block 107 of the component 100.

The receiver component 101 includes a block 108 labeled "pattern", which can consist of pattern storage or pattern generation circuitry, and which is used as a source of expected patterns. A block 109 labeled "compare" enables the received pattern set to be compared to the expected pattern set, and causes an adjustment to be made to either the transmitter or receiver. The receiver sample point can be adjusted by the block 112 labeled "adjust".

FIG. 4 shows two components 100, 101 connected with a unidirectional link 102, in which components of FIG. 3 are given like reference numerals. In the embodiment of FIG. 4, only the receiver sample point can be adjusted; the transmitter drive point remains fixed during system operation. Thus, there is no adjust block 107 in the component 100, nor is there a need for sideband communication channel 113 of FIG. 4.

FIG. 5 shows two components 100, 101 connected with a unidirectional link 102, in which components of FIG. 3 are given like reference numerals. In the embodiment of FIG. 5, only the transmitter drive point can be adjusted; the receiver sample point remains fixed during system operation. Thus, there is no adjust block 112 in the component 101 of FIG. 5.

In general, periodic timing calibration can be performed on all three examples, since timing variations due to condition drift can be compensated at either the transmitter end or the receiver end. In practice, it is cheaper to put the adjustment circuitry at only one end of the link, and not at both ends, so systems of FIG. 4 or 5 would have an advantage. Also, it should be noted that system of FIG. 4 does not need to communicate information from the "compare" block 109 in the receiver component 101 back to the transmitter component 100, and thus might have implementation benefits over system of FIG. 5.

Calibration Steps for Transmitter for Unidirectional Link

FIG. 6 shows the example from FIG. 5, and also includes the steps needed to perform a timing calibration update.

(Step 601) Suspend normal transmit and receive operations, by completing transactions in progress and preventing new ones from beginning, or by interrupting transactions that are in progress.

(Step 602) Change the drive point of the transmit component from the "TX" operation value (used for normal operations) to either the "TXA" or "TXB" edge value (used for calibration operations) in the "adjust" block. The "TX" operation value may be a simple average of "TXA" and "TXB," i.e. a center value, or it may be another function of "TXA" and "TXB," such as a weighted average. It may be necessary to impose a settling delay at this step to allow the new drive point to become stable.

(Step 603) Change "mux" block of the transmit component so that the "pattern" block input is enabled.

(Step 604) A pattern set is created in the "pattern" block of the transmit component and is transmitted onto the "link" using the TXA or TXB drive point.

(Step 605) The pattern set is received in the receive component. Note that the sample point of the receiver is fixed relative to the reference clock of the system.

(Step 606) The received pattern set is compared in the "compare" block to the expected pattern set produced by the "pattern" block in the receive component. The two pattern sets will either match or not match. As a result of this comparison (and possibly other previous comparisons) a pass or fail determination will be made.

(Step 607) Adjust either the "TXA" or "TXB" edge value in the transmit component as a result of the pass or fail determination. The "TX" operation value in the transmit component is also adjusted. This adjustment may only be made after a calibration sequence including transmission of two or more of calibration patterns has been executed, in order to ensure some level of repeatability.

(Step 608) Change the drive point of the transmitter from the "TXA" or "TXB" edge value (used for calibration operations) to "TX" operation value (used for normal operations) in the "adjust" block of the transmit component. It may be necessary to impose a settling delay at this step to allow the new drive point to become stable.

(Step 609) Change "mux" block of the transmit component so that the "normal path" input is enabled.

(Step 610) Resume normal transmit and receive operations.

Timing for Iteration Step for Transmit

Figure 7:
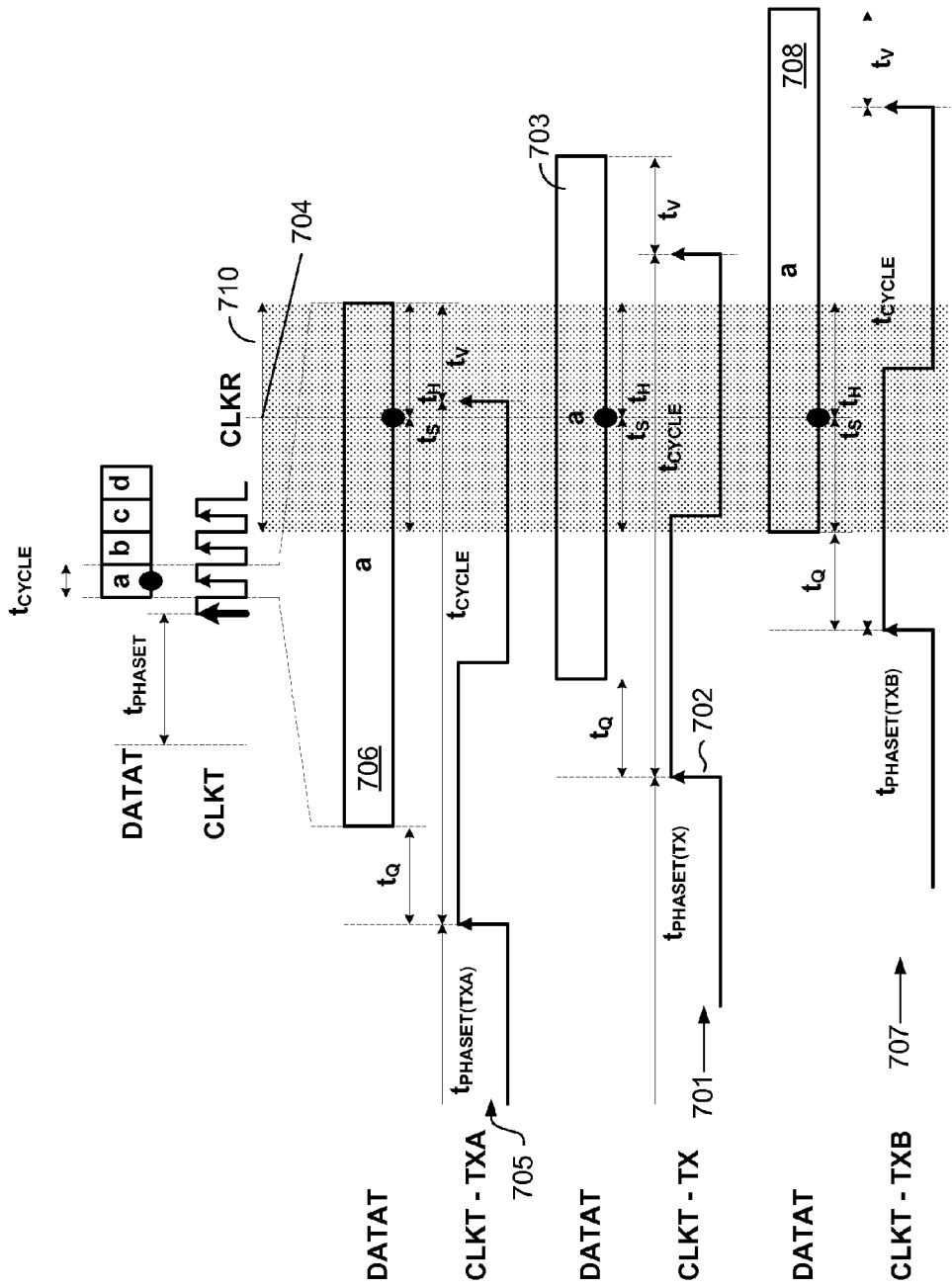
FIG. 7 illustrates timing for iteration steps for calibrating a transmitter drive point.

FIG. 7 includes the timing waveforms used by the calibration steps of FIG. 6 for a system like that of FIG. 5. These timing waveforms are similar to those from FIG. 2, except that the drive point is adjusted to straddle the sampling window of the receiver in order to track the edges of the valid window of the transmitter.

The "adjust" block in the transmit component maintains three values in storage: TXA, TX, and TXB. The TX value is the operation value used for normal operation. The TXA and TXB are the "edge" values, which track the left and right extremes of the bit window of the transmitter. Typically, the TX value is derived from the average of the TXA and TXB values, but other relationships are possible. The TXA and TXB values are maintained by the calibration operations, which from time to time, and periodically in some embodiments, interrupt normal operations.

In FIG. 7, the position of the rising edge of CLKT has an offset of $t_{PHASET}$ relative to a fixed reference (typically a reference clock that is distributed to all components).

When the TX value is selected ($t_{PHASET(TX)}$ in the middle trace 701 showing CLKT timing waveform) for operation, the rising edge 702 of CLKT causes the DATAT window 703 containing the value "a" to be aligned so that the DATAR signal (not shown but conceptually overlapping with the DATAT signal) at the receiving component is aligned with the receiver clock, successfully received, and ideally centered on the receiver eye.

When the TXA value is selected ($t_{PHASET(TXA)}$ in the top trace 705 showing CLKT timing waveform), the rising edge of CLKT is set to a time that causes the right edges of the DATAT window 706 (containing "a") and the receiver setup/hold window 710 (shaded) to coincide. The $t_S$ setup time and $t_H$ hold time surround the CLKR rising edge, together define the setup/hold window 710 (not to be confused with the receiver eye of FIG. 2) in which the value of DATAR must be stable for reliable sampling around a given CLKR rising edge 704. Since the DATAT window, and the resulting DATAR window, are larger than this setup/hold window 710, the transmitter has timing margin. However, in the case shown on trace 705 with the transmit clock rising edge at offset $t_{PHASET(TXA)}$, all the timing margin is on the left side of the transmitter eye for the setup/hold window 710, adding delay after the $t_Q$ timing parameter. There is essentially no margin for the $t_V$ timing parameter in the trace 705, so that the offset defines the left edge of the calibration window.

The calibration process for TXA will compare the received pattern set to the expected pattern set, and determine if they match. If they match (pass) then the TXA value will be decremented (the $T_{PHASET(TXA)}$ offset becomes smaller shifting the transmit window 706 to the left in FIG. 7) or otherwise adjusted, so there is less margin for the $t_V$ timing parameter relative to the receiver window 710. If they do not match (fail) then the TXA value will be incremented (the $T_{PHASET(TXA)}$ offset becomes larger shifting the transmit window 706 to the right in FIG. 7, or otherwise adjusted, so there is more margin for the $t_V$ timing parameter.

As mentioned earlier, the results of a sequence including transmission of two or more calibration patterns may be accumulated before the TXA value is adjusted. This would improve the repeatability of the calibration process. For example, the calibration pattern could be repeated "N" times with the number of passes accumulated in a storage element. If all N passes match, then the TXA value is decremented. If any of the N passes does not match, then the TXA value is determined to have reached the edge of the window and is incremented. In another alternative, after the Nth pattern, the TXA value could be incremented if there are fewer than N/2 (or some other threshold number) passes, and decremented if there are N/2 or more passes.

When TXA is updated, the TX value will also be updated. In this example, the TX value will updated by half the amount used to update TXA, since TX is the average of the TXA and TXB values. If TX has a different relationship to TXA and TXB, the TX update value will be different. Note that in some embodiments, the TX value will need slightly greater precision than the TXA and TXB values to prevent round-off error. In alternate embodiments, the TX value can be updated after pass/fail results of TXA and TXB values have been determined. In some cases, these results may cancel and produce no change to the optimal TX value. In other cases these results may be accumulated and the accumulated results used to determine an appropriate adjustment of the TX setting. According to this embodiment, greater precision of the TX setting relative to the TXA and TXB settings may not be required.

When the TXB value is selected ($t_{PHASER(TXB)}$ in the bottom trace 707 showing a CLKT timing waveform) for calibration, the rising edge of CLKT is set to a time that causes the left edge of the transmitter valid window 708 (containing "a") and the receiver setup/hold window 710 (shaded) to coincide. In this case with the transmit clock rising edge at $t_{PHASER(TXB)}$, all the timing margin is on the right side of the transmit window 708, providing more room than required by the $t_V$ timing parameter. This means that there will be essentially no margin for the $t_Q$ timing parameter on the left side of the window 708, defining the right edge of the calibration window.

The calibration process will compare the received pattern set to the expected pattern set, and determine if they match. If they match (pass) then the TXB value will be incremented (the offset becomes larger) or otherwise adjusted, so there is less margin for the $t_Q$ timing parameter. If they do not match (fail) then the TXB value will be decremented (the offset becomes smaller) or otherwise adjusted, so there is more margin for the $t_Q$ timing parameter.

As mentioned earlier, the results of transmission of two or more calibration patterns may be accumulated before the TXB value is adjusted. For example, transmission of the patterns could be repeated "N" times with the number of passes accumulated in a storage element. After the Nth sequence the TXB value could be decremented if there are fewer than N/2 passes and incremented if there are N/2 or more passes. This would improve the repeatability of the calibration process.

When TXB is updated, the TX value will also be updated. In this example, the TX value will updated by half the amount used to update TXB, since TX is the average of the TXA and TXB values. If TX has a different relationship to TXA and TXB, the TX update value will be different. Note that the TX value will need slightly greater precision than the TXA and TXB values if it is desired to prevent round-off error.

Calibration Steps for Receiver for Unidirectional Link

Figure 8:
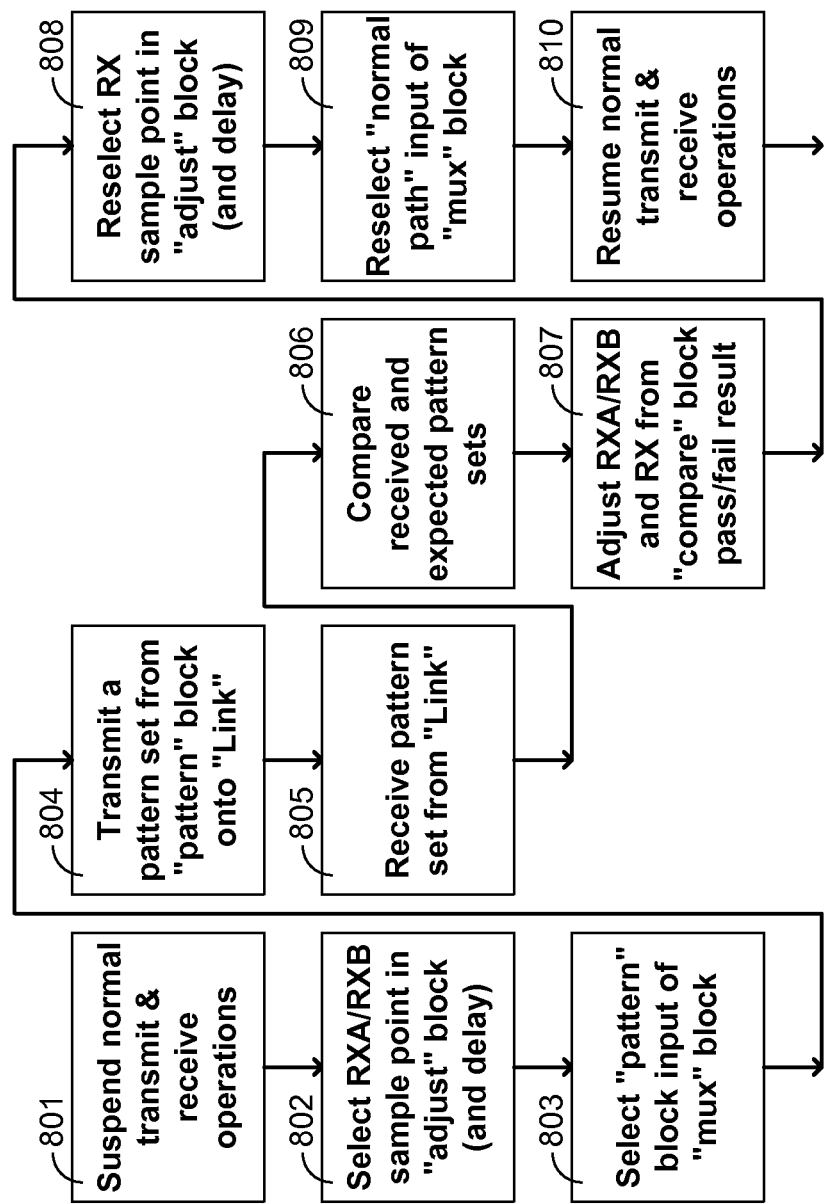
FIG. 8 is a flow chart illustrating calibration steps for a receiver on a unidirectional link for a sample point.

FIG. 8 shows the example from FIG. 4, and also includes the steps needed to perform a timing calibration update. Note that only steps (Block 802), (Block 807), and (Block 808) are different relative to the steps in FIG. 6.

(Step 801) Suspend normal transmit and receive operations, by completing transactions in progress and preventing new ones from beginning, or by interrupting transactions that are in progress.

(Step 802) Change the sample point of the receive component from the "RX" operation value (used for normal operations) to either the "RXA" or "RXB" edge value (used for calibration operations) in the "adjust" block. The "RX" operation value may be a simple average of "RXA" and "RXB," i.e. a center value, or it may be another function of "RXA" and "RXB," such as a weighted average. It may be necessary to impose a settling delay at this step to allow the new sample point to become stable.

(Step 803) Change "mux" block of the transmit component so that the "pattern" block input is enabled.

(Step 804) A pattern set is created in the "pattern" block of the transmit component and is transmitted onto the "link" using the TXA or TXB drive point.

(Step 805) The pattern set is received in the receive component. Note that the transmit point of the transmitter is fixed relative to the reference clock of the system.

(Step 806) The received pattern set is compared in the "compare" block to the expected pattern set produced by the "pattern" block in the receive component. The two pattern sets will either match or not match. As a result of this comparison (and possibly other previous comparisons) a pass or fail determination will be made.

(Step 807) Adjust either the "RXA" or "RXB" edge value in the receive component as a result of the pass or fail determination. The "RX" operation value in the transmit component is also adjusted. This adjustment may only be made after two or more of these calibration sequences have been executed, in order to ensure some level of repeatability.

(Step 808) Change the sample point of the receiver from the "RXA" or "RXB" edge value (used for calibration operations) to "RX" operation value (used for normal operations) in the "adjust" block of the receive component. It may be necessary to impose a settling delay at this step to allow the new sample point to become stable.

(Step 809) Change "mux" block of the transmit component so that the "normal path" input is enabled.

(Step 810) Resume normal transmit and receive operations.

Timing for Iteration Step for Receive

Figure 9:
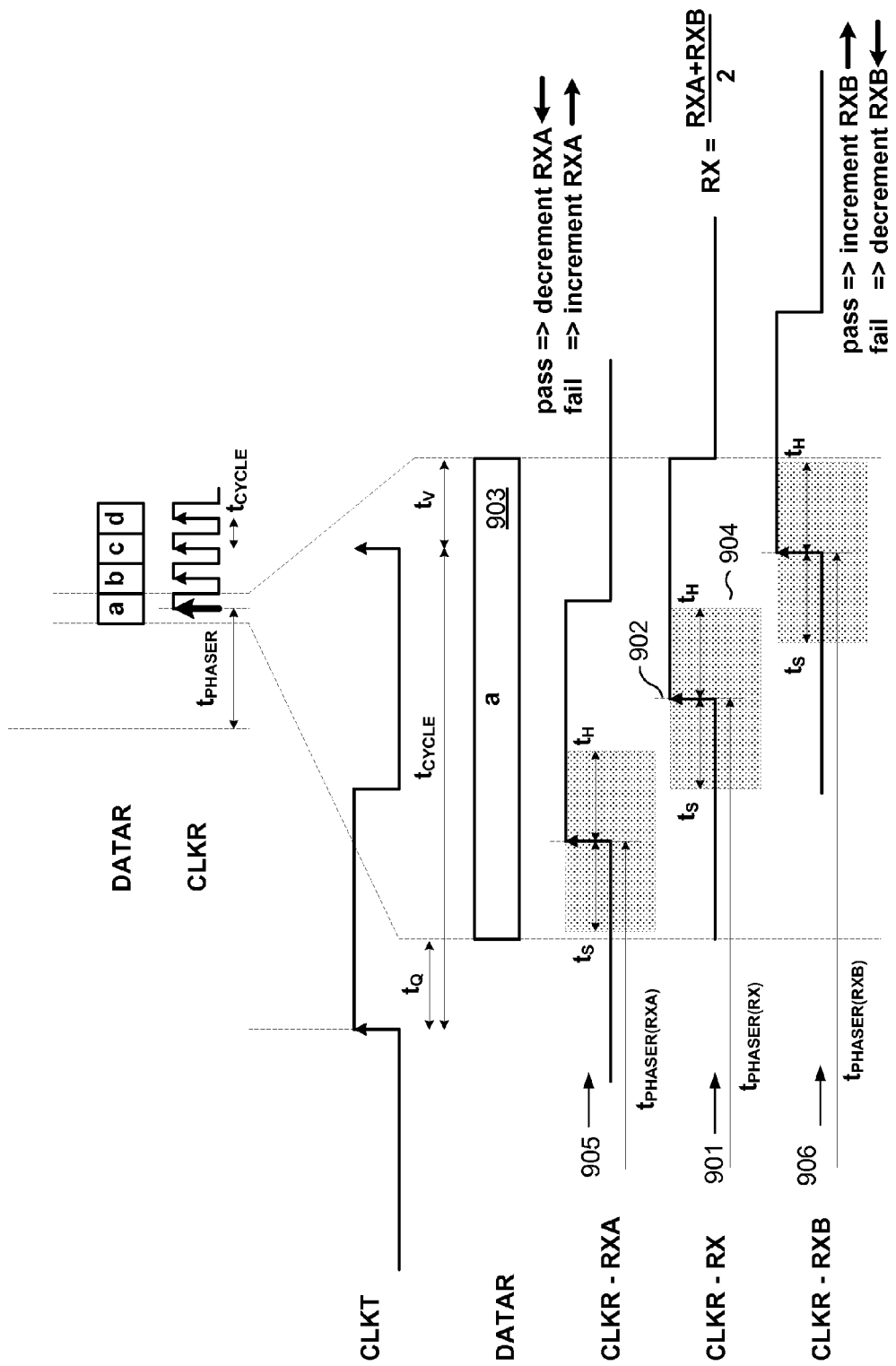
FIG. 9 illustrates timing for iteration steps for calibrating a receiver sample point.

FIG. 9 shows includes the timing waveforms used by the receiver calibration steps of FIG. 8 for a system configured for example as shown in FIG. 4. These timing waveforms are similar to those from FIG. 2, except that the sampling point is adjusted within the bit window in order to track the edges of the window.

The "adjust" block in the receive component maintains three values in storage: RXA, RX, and RXB. The RX value is the operation value used for normal operation. The RXA and RXB are the "edge" values, which track the left and right extremes of the bit window. Typically, the RX value is derived from the average of the RXA and RXB values, but other relationships are possible. The RXA and RXB values are maintained by the calibration operations, which periodically or otherwise from time to time interrupt normal operations.

In the timing diagrams, the position of the rising edge of CLKR has an offset of $t_{PHASER}$ relative to a fixed reference (not shown, typically a reference clock that is distributed to all components). This offset is determined by the RXA, RX, and RXB values that are stored.

When the RX value is selected ($t_{PHASER(RX)}$ in the middle trace 901 showing a CLKR timing waveform) for use in receiving data, the rising edge 902 of CLKR is approximately centered in the receiver eye of the DATAR signal containing the value "a". The DATAR signal is the DATAT signal transmitted at the transmitter after propagation across the link, and can be conceptually considered to be the same width as DATAT as shown in FIG. 9. The receiver eye is shown in FIG. 2. The $t_S$ setup time is the minimum time before the clock CLKR rising edge which must be within the DATAR window 903, and the $t_H$ hold time is the minimum time after the clock CLKR rising edge that must be within the DATAR window 903, together defining the setup/hold window 904 (not to be confused with the receiver eye of FIG. 2) in which the value of DATAR must be stable for reliable sampling around a given CLKR rising edge. Since the valid window 904 of the DATAR signal is larger than this setup/hold window 904, the receiver has timing margin in both directions.

When the RXA value is selected ($t_{PHASER(RXA)}$ in the top trace 905 showing a CLKR timing waveform), the rising edge of CLKR is approximately a time $t_S$ later than the left edge (the earliest time) of the DATAR window 903 containing the value "a". In this case, the CLKR rising edge is on the left edge of the receiver eye, and all the timing margin is on the right side of the setup/hold window 904, providing more room than is required by the $t_H$ timing parameter. This means that there will be essentially no margin for the $t_S$ timing parameter, defining the left edge of the calibration window.

The calibration process will compare the received pattern set to the expected pattern set, and determine if they match. If they match (pass) then the RXA value will be decremented (the offset becomes smaller) or otherwise adjusted, so there is less margin for the $t_S$ timing parameter. If they do not match (fail) then the RXA value will be incremented (the offset becomes larger) or otherwise adjusted, so there is more margin for the $t_S$ timing parameter.

As mentioned earlier, the results of transmission and reception of two or more calibration patterns may be accumulated before the RXA value is adjusted. For example, the patterns could be repeated "N" times with the number of passes accumulated in a storage element. After the Nth sequence the RXA value could be incremented if there are fewer than N/2 passes and decremented if there are N/2 or more passes. This would improve the repeatability of the calibration process.

When RXA is updated, the RX value will also be updated. In this example, the RX value will updated by half the amount used to update RXA, since RX is the average of the RXA and RXB values. If RX has a different relationship to RXA and RXB, the RX update value will be different. Note that in some embodiments, the RX value will need slightly greater precision than the RXA and RXB values to prevent round-off error. In alternate embodiments, the RX value can be updated after pass/fail results of RXA and RXB values have been determined. In some cases, these results may cancel and produce no change to the optimal RX value. In other cases these results may be accumulated and the accumulated results used to determine an appropriate adjustment of the RX setting. According to this embodiment, greater precision of the RX setting relative to the RXA and RXB settings may not be required.

When the RXB value is selected ($t_{PHASER(RXB)}$ in the bottom trace 906 showing a CLKR timing waveform), the rising edge of CLKR is approximately a time $t_H$ earlier than the right edge (the latest time) of the DATAR window 903 containing the value "a". In this case, the CLKR rising edge is on the right edge of the receiver eye, and all the timing margin is on the left side of the window 904, providing more room that required by the $t_S$ timing parameter. This means that there will be essentially no margin for the $t_H$ timing parameter, defining the right edge of the calibration window.

The calibration process will compare the received pattern set to the expected pattern set, and determine if they match. If they match (pass) then the RXB value will be incremented (the offset becomes larger) or otherwise adjusted, so there is less margin for the tH timing parameter. If they do not match (fail) then the RXB value will be decremented (the offset becomes smaller) or otherwise adjusted, so there is more margin for the $t_H$ timing parameter.

As mentioned earlier, the results of transmission and reception of two or more calibration patterns may be accumulated before the RXB value is adjusted. For example, the sequence could be repeated "N" times with the number of passes accumulated in a storage element. After the Nth sequence the RXB value could be decremented if there are fewer than N/2 passes and incremented if there are N/2 or more passes. This would improve the repeatability of the calibration process.

When RXB is updated, the RX value will also be updated. In this example, the RX value will updated by half the amount used to update RXB, since RX is the average of the RXA and RXB values. If RX has a different relationship to RXA and RXB, the RX update value will be different. Note that the RX value will need slightly greater precision than the RXA and RXB values if it is desired to prevent round-off error.

Bidirectional Link Alternatives

FIG. 10 shows an example of a bidirectional link. In this case, component A (1000) and component B (1001) each contain a transmitter and receiver connected to the link, so that information may be sent either from A to B or from B to A. The elements of the unidirectional example in FIG. 3 is replicated (two copies) to give the bidirectional example in FIG. 10. FIG. 10 shows two bidirectional components 1000, 1001 connected with an interconnection medium referred to as Link 1002. Normal path 1010 acts as a source of data signals for normal operation of component 1000 during transmit operations. Normal path 1031 acts as a destination of data signals for component 1000, during normal receive operations. Likewise, normal path 1030 acts as a source of data signals for normal operation of component 1001 during transmit operations. Normal path 1011 acts as a destination of data signals for component 1001, during normal receive operations.

The first bidirectional component includes a block 1005 labeled "pattern", which can consist of pattern storage or pattern generation circuitry, and which is used as a source of transmit calibration patterns. A multiplexer block 1006 labeled "mux," implemented for example using a logical layer or physical layer switch, enables the transmit calibration pattern set to be driven onto the link by the transmitter circuit 1003. The transmitter drive point can be adjusted by the block 1007 labeled "adjust". A sideband communication channel 1013 is shown coupled between the component 1001 and the component 1000, by which the results of analysis of received calibration patterns at the component 1001 are supplied to the adjust block 1007 of the component 1000. Component 1000 also has support for calibrating receiver 1024, including a block 1028 labeled "pattern", which can consist of pattern storage or pattern generation circuitry, and which is used as a source of expected patterns for comparison with received patterns. A block 1029 labeled "compare" enables the received pattern set to be compared to the expected pattern set, and causes an adjustment to be made to either the transmitter or receiver. The receiver sample point can be adjusted by the block 1032 labeled "adjust".

The second bidirectional component 1001 includes complementary elements supporting transmitter 1023 and receiver 1004. For the receiver operations, a block 1008 labeled "pattern", which can consist of pattern storage or pattern generation circuitry, and which is used as a source of expected patterns. A block 1009 labeled "compare" enables the received pattern set to be compared to the expected pattern set, and causes an adjustment to be made to either the transmitter or receiver. The receiver sample point can be adjusted by the block 1012 labeled "adjust". The second bidirectional component 1001 supports transmission operations, with elements including a block 1025 labeled "pattern", which can consist of pattern storage or pattern generation circuitry, and which is used as a source of transmit calibration patterns. A multiplexer block 1026 labeled "mux," implemented for example using a logical layer or physical layer switch, enables the transmit calibration pattern set to be driven onto the link by the transmitter circuit 1023. The transmitter drive point can be adjusted by the block 1027 labeled "adjust". A sideband communication channel 1033 is shown coupled between the component 1000 and the component 1001, by which the results of analysis of received calibration patterns at the component 1000 are supplied to the adjust block 1027 of the component 1001.

The example of FIG. 10 allows both receive sample points and both transmit drive points to be adjusted. However, the benefit of adjustable timing can be realized if there is only one adjustable element in each direction.

The example of FIG. 11 (using the same reference numerals as FIG. 10) shows an example in which only the receiver sample points are adjustable. Thus, elements 1007 and 1027 of FIG. 10 are not included in this embodiment. This is equivalent to two copies of the elements of example in FIG. 4.

Figures 12, 13:
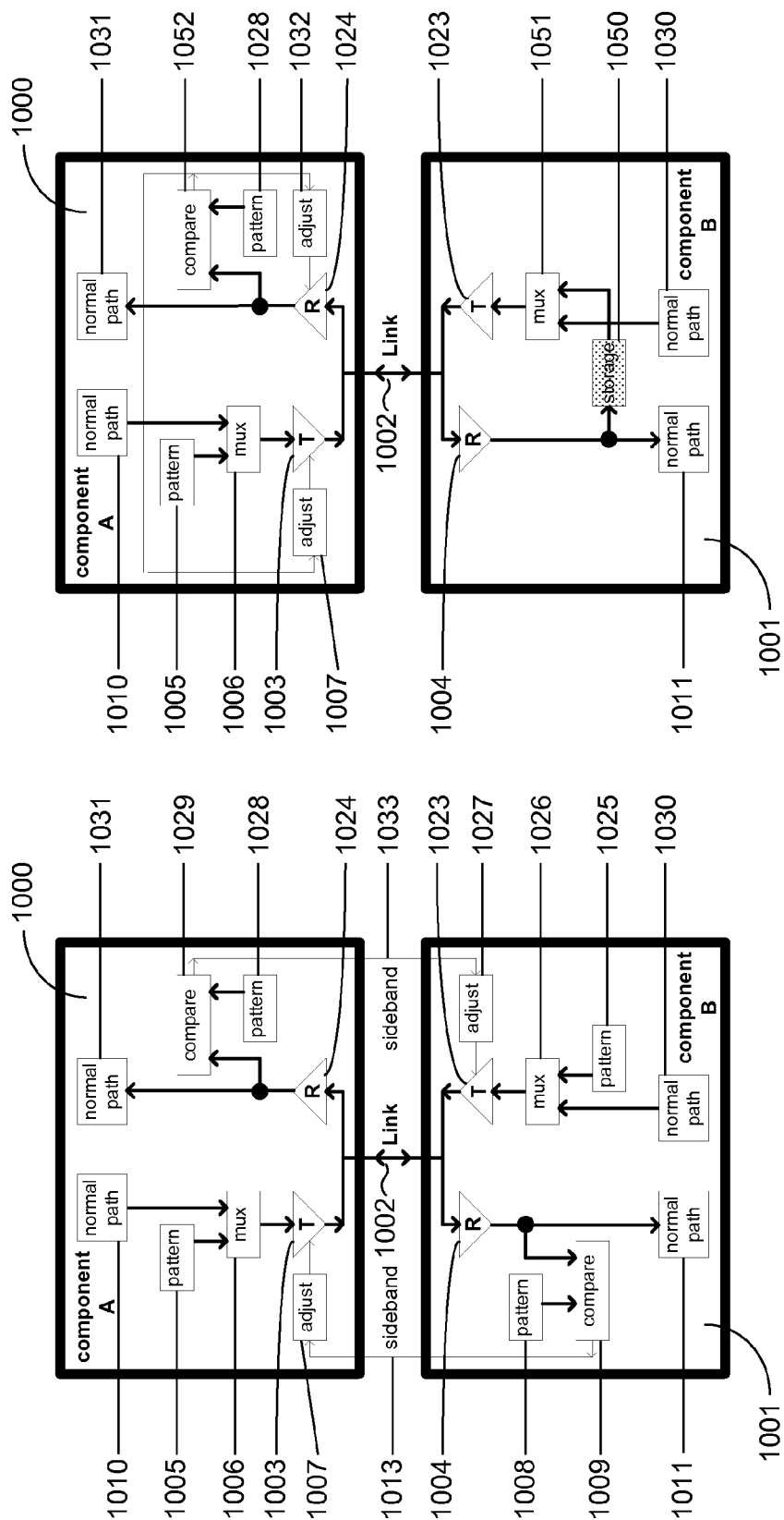
FIG. 12 illustrates an embodiment of the present invention where both components have adjustable transmitter drive points.
FIG. 13 illustrates an embodiment of the present invention where a transmitter drive point and a receiver sample point of only one component on a bidirectional link are adjustable.

The example of FIG. 12 (using the same reference numerals as FIG. 10) shows an example in which only the transmitter drive points are adjustable. Thus, elements 1012 and 1032 of FIG. 10 are not included in this embodiment. This is equivalent to two copies of the elements of example in FIG. 5.

The example of FIG. 13 (using the same reference numerals as FIG. 10) shows an example in which the receiver sample point and transmitter drive point of the first bidirectional component 1000 are adjustable. Thus, elements 1012, 1008, 1009, 1027, 1026, 1025 are not included in this embodiment. A storage block 1050 is added between the receiver and a "mux" block 1051. The "mux" block 1051 is used to select between a normal source of signals 1030 and the storage block 1050. Also, the compare block 1052 is used for analysis of both transmit and receive calibration operations, and is coupled to both the adjust block 1007 for the transmitter, and adjust block 1032 for the receiver. This alternative is important because all the adjustment information can be kept within one component, eliminating the need for sideband signals for the calibration process. If component 1001 were particularly cost sensitive, this could also be a benefit, since only one of the components must bear the cost of the adjustment circuitry.

Calibration Steps for Transmitter for Bidirectional Link

The calibration steps for bidirectional examples in FIGS. 10, 11 and 12 can be essentially identical to the calibration steps already discussed for unidirectional examples in FIGS. 4 and 5. However, the asymmetry in bidirectional example of FIG. 13 will introduce some additional calibration steps, and will receive further discussion.

Figure 14:
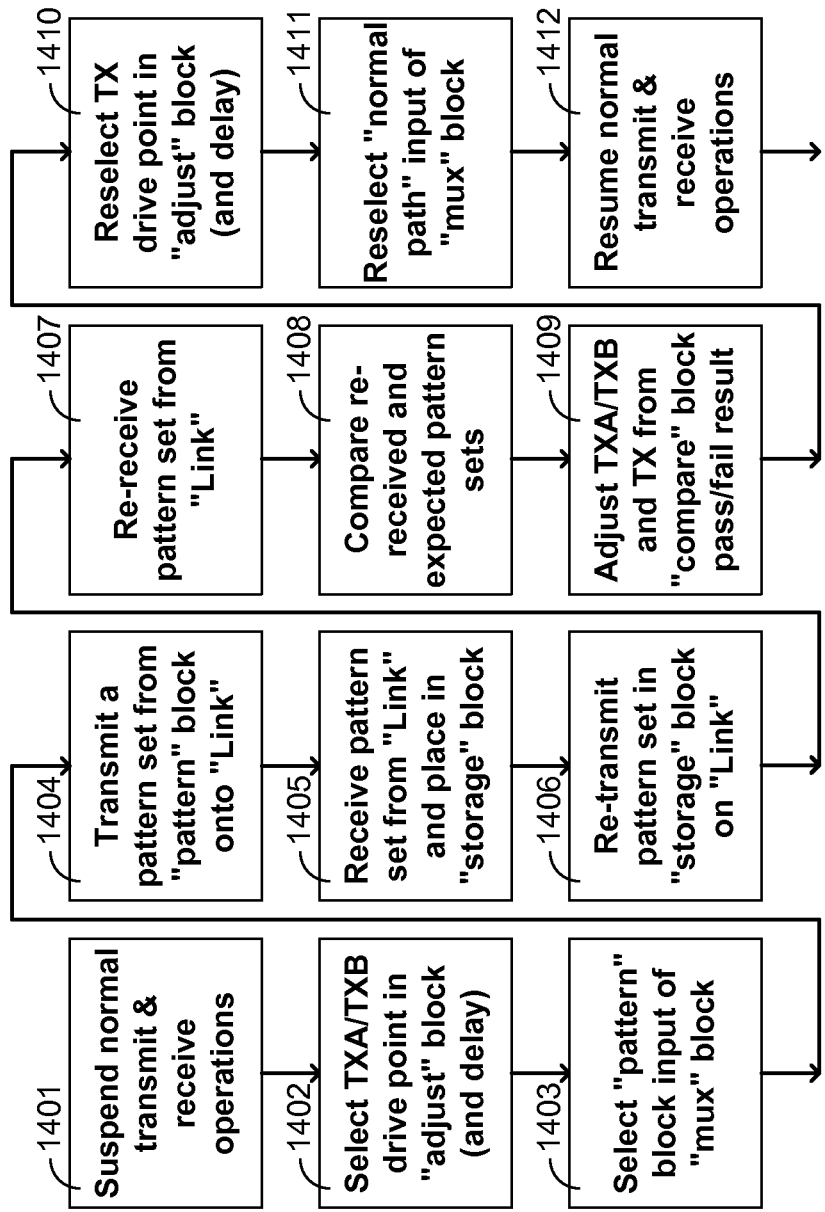
FIG. 14 is a flow chart illustrating calibration steps for a transmitter drive point for a bidirectional link.

FIG. 14 shows the example from FIG. 13, and also includes the steps needed to perform a timing calibration update.

(Step 1401) Suspend normal transmit and receive operations, by completing transactions in progress and preventing new ones from beginning, or by interrupting transactions that are in progress.

(Step 1402) Change the drive point of the transmit component (A) from the "TX" operation value (used for normal operations) to either the "TXA" or "TXB" edge value (used for calibration operations) in the "adjust" block. It may be necessary to impose a settling delay at this step to allow the new drive point to become stable.

(Step 1403) Change "mux" block of the transmit component (A) so that the "pattern" block input is enabled.

(Step 1404) A pattern set is created in the "pattern" block of the transmit component (A) and is transmitted onto the "link" using the TXA or TXB drive point.

(Step 1405) The pattern set is received in the receive component (B). Note that the sample point of the receiver is fixed relative to the reference clock of the system. The received pattern set is held in the "storage" block in component B.

(Step 1406) The "mux" block input connected to the "storage" block in component B is enabled. The pattern set is re-transmitted onto the link by component B.

(Step 1407) The pattern set is received by component A from the link.

(Step 1408) The received pattern set is compared in the "compare" block to the expected pattern set produced by the "pattern" block in the receive component (A). The two pattern sets will either match or not match. As a result of this comparison (and possibly other previous comparisons) a pass or fail determination will be made.

(Step 1409) Adjust either the "TXA" or "TXB" edge value in the transmit component (A) as a result of the pass or fail determination. The "TX" operation value in the transmit component (A) is also adjusted. This adjustment may only be made after two or more of these calibration sequences have been executed, in order to ensure some level of repeatability.

(Step 1410) Change the drive point of the transmitter from the "TXA" or "TXB" edge value (used for calibration operations) to "TX" operation value (used for normal operations) in the "adjust" block of the transmit component (A). It may be necessary to impose a settling delay at this step to allow the new drive point to become stable.

(Step 1411) Change "mux" block of the transmit component (A) so that the "normal path" input is enabled.

(Step 1412) Resume normal transmit and receive operations.

Calibration Steps for Receiver for Bidirectional Link

The calibration steps for bidirectional examples of FIGS. 10, 11, and 12 can be essentially identical to the calibration steps already discussed for unidirectional examples of FIGS. 4 and 5. However, the asymmetry in bidirectional example of FIG. 13 will introduce some additional calibration steps, and will receive further discussion.

Figure 15:
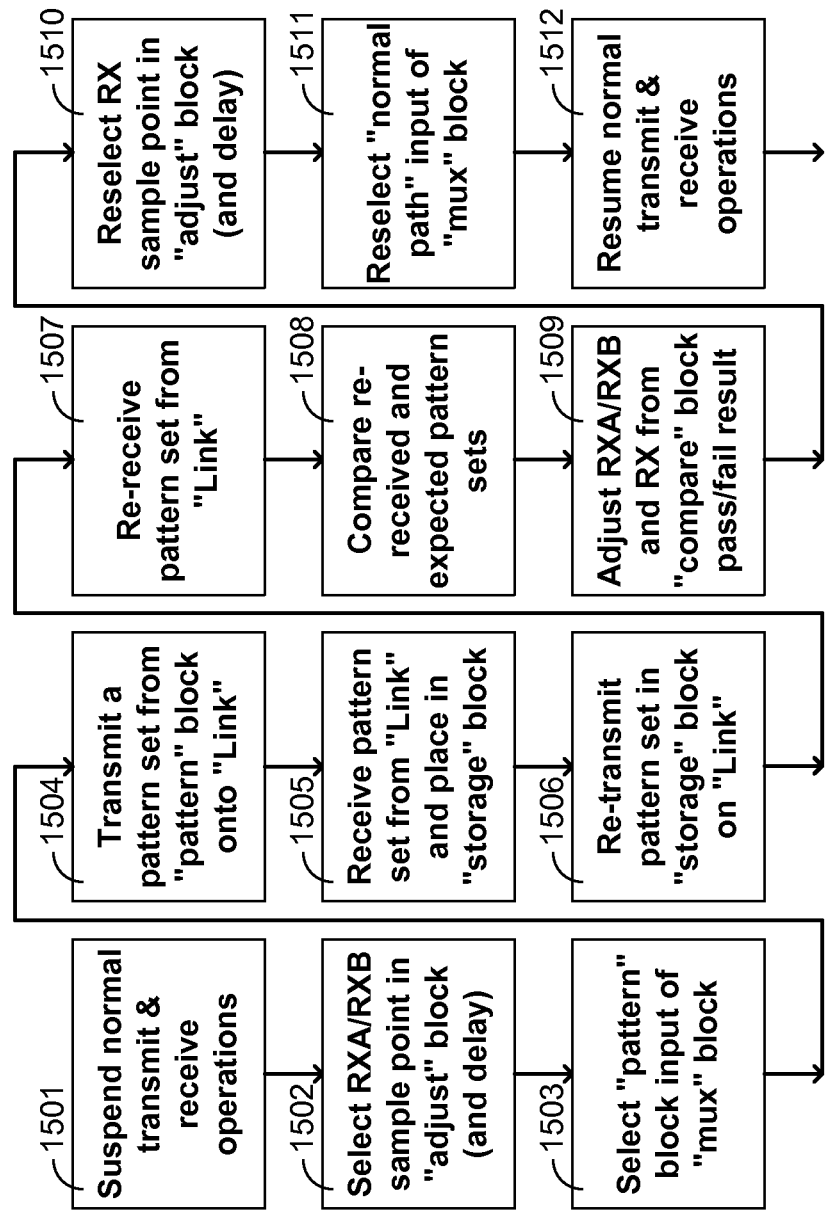
FIG. 15 is a flow chart illustrating calibration steps for a receiver sample point for a bidirectional link.

FIG. 15 shows the example from FIG. 13, and also includes the steps needed to perform a timing calibration update.

(Step 1501) Suspend normal transmit and receive operations, by completing transactions in progress and preventing new ones from beginning, or by interrupting transactions that are in progress.

(Step 1502) Change the sample point of the receive component (A) from the "RX" operation value (used for normal operations) to either the "RXA" or "RXB" edge value (used for calibration operations) in the "adjust" block. It may be necessary to impose a settling delay at this step to allow the new drive point to become stable.

(Step 1503) Change "mux" block of the transmit component (A) so that the "pattern" block input is enabled.

(Step 1504) A pattern set is created in the "pattern" block of the transmit component (A) and is transmitted onto the "link". The normal transmit drive point is used.

(Step 1505) The pattern set is received in the receive component (B). Note that the sample point of the receiver is fixed relative to the reference clock of the system and is not adjustable. The received pattern set is held in the "storage" block in component B.

(Step 1506) The "mux" block input connected to the "storage" block in component B is enabled. The pattern set is re-transmitted onto the link by component B.

(Step 1507) The pattern set is received by component A from the link using either the RXA or RXB value to determine the receiver sample point.

(Step 1508) The received pattern set is compared in the "compare" block to the expected pattern set produced by the "pattern" block in the receive component (A). The two pattern sets will either match or not match. As a result of this comparison (and possibly other previous comparisons) a pass or fail determination will be made.

(Step 1509) Adjust either the "RXA" or "RXB" edge value in the receive component (A) as a result of the pass or fail determination. The "RX" operation value in the receive component (A) is also adjusted. This adjustment may only be made after two or more of these calibration sequences have been executed, in order to ensure some level of repeatability.

(Step 1510) Change the sample point of the receiver from the "RXA" or "RXB" edge value (used for calibration operations) to "RX" operation value (used for normal operations) in the "adjust" block of the receive component (A). It may be necessary to impose a settling delay at this step to allow the new sample point to become stable.

(Step 1511) Change "mux" block of the transmit component (A) so that the "normal path" input is enabled.

(Step 1512) Resume normal transmit and receive operations.

Bidirectional Link—Storage Options

The bidirectional example in FIG. 13 utilizes a storage block 1050 as part of the calibration process. There are a number of alternative options for implementing this storage, each option with its own costs and benefits.

FIG. 13 shows an option in which the storage block is implemented as part of the interface containing the transmit and receive circuits. This has the benefit that the circuitry used for normal operations (the "normal path") is not significantly impacted. The cost of this option is that the storage block will increase the size of the interface, and will thus increase the manufacturing cost of the component 1001.

Figure 16:
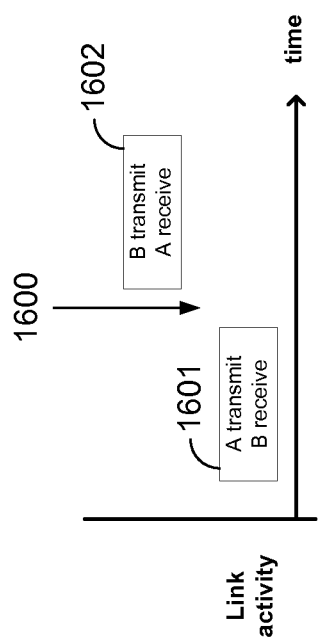
FIG. 16 and FIG. 17 illustrate time intervals for operation of components on a bidirectional link during calibration using a system like that of FIG. 13.
Figure 17:
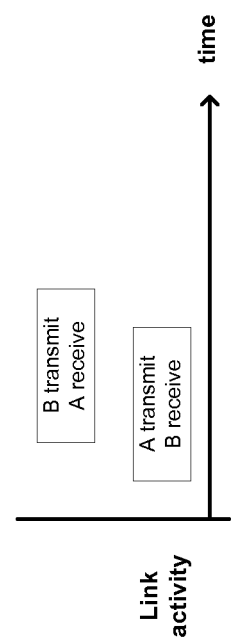

FIG. 16 and FIG. 17 show why a storage block is needed for the implementations of example of FIG. 13. The storage allows the received pattern set in component 1001 to be held (and delayed) prior to being re-transmitted. FIG. 16 shows a gap 1600 between the interval 1601 in which the pattern set is being transmitted by A (and received by B) and the interval 1602 in which the pattern set being transmitted by B (and received by A). If no storage was present, there would be a relatively small delay between the start of each these two intervals resulting in an overlap of the intervals, as shown in FIG. 17. In general, components on a bidirectional link are not allowed to transmit simultaneously, so some storage will be required with the configuration of FIG. 13 to prevent this.

It is possible to design the transmitter circuits and the link so that transmitters on both ends are enabled simultaneously. This is called simultaneous bidirectional signaling. In such a communication system, the storage block of configuration of FIG. 13 could be left out of component 1001. Typically, simultaneous bidirectional signaling requires additional signal levels to be supported. For example, if each of two transmitters can be signaling a bit, there are four possible combinations of two transmitters simultaneously driving one bit each. The four combinations are $\{0/0, 0/1, 1/0, 1/1\}$. Typically the 0/1 and 1/0 combinations will produce the same composite signal on the link. This requires that the transmitter circuits be additive, so that three signal levels are produced $\{0, 1, 2\}$. The receiver circuits will need to discriminate between these three signal levels. A final requirement of simultaneous bidirectional signaling is that a component must subtract the value it is currently transmitting from the composite signal that it is currently receiving in order to detect the actual signal from the other component. When these requirements are in place, the storage block requirement can be dropped. This is one of the benefits of this approach. The cost of this approach is the extra design complexity and reduced voltage margins of simultaneous bidirectional signaling.

Figure 18:
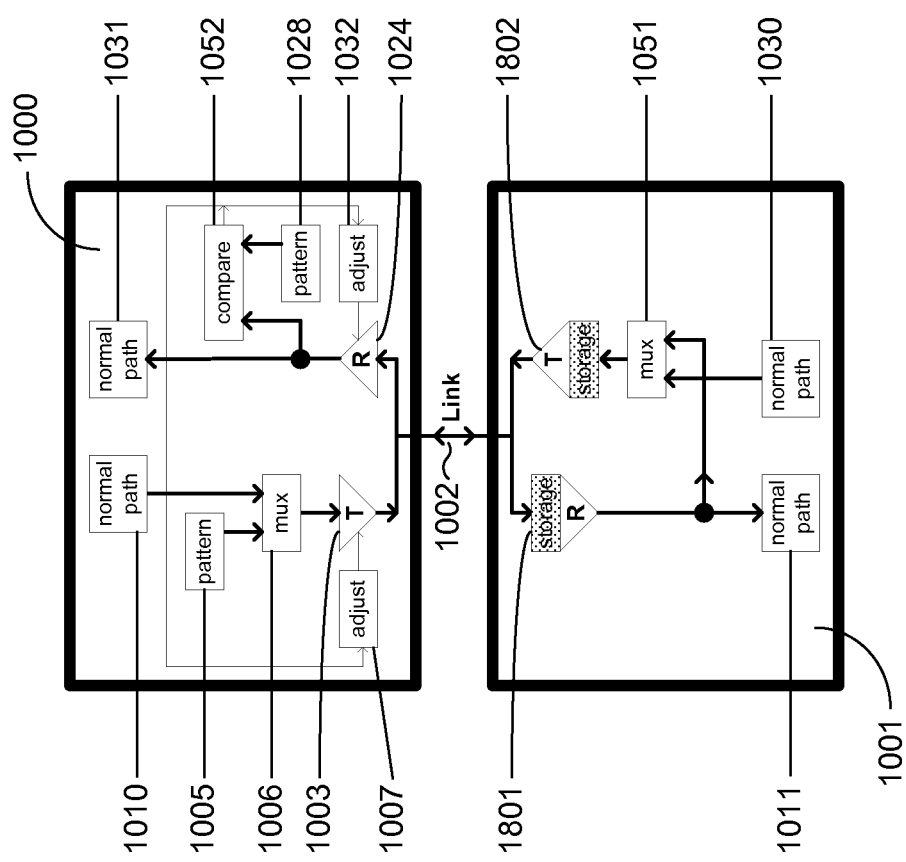
FIG. 18 illustrates a first embodiment of the invention including storage for calibration patterns on one component.

FIG. 18 shows option B in which the storage block is implemented from the storage elements 1801, 1802 that are normally present in the transmit and receive circuits. These storage elements are typically present for pipelining (delaying) the information flowing on the normal paths. Storage elements may also be present to perform serialization and deserialization. This would be required if the internal and external signal groups have different widths. For example, the external link could consist of a single differential wire pair carrying information at the rate or 3200 Mb/s, and could connect to a set of eight single-ended internal wires carrying information at the rate of 400 Mb/s. The information flow is balanced (no information is lost), but storage is still required to perform serial-to-parallel or parallel-to-serial conversion between the two sets of signals. This storage will create delay, which can be used to offset the two pattern sets in the option of FIG. 18. The benefit of this approach is that no extra storage must be added to component 1001. The cost is that the wiring necessary to connect the receiver to a "mux" block in the transmitter may be significant. Another cost is that the amount of storage naturally present in the receiver and transmitter may be relatively small, limiting the length of the pattern set which can be received and retransmitted with this approach.

Figure 19:
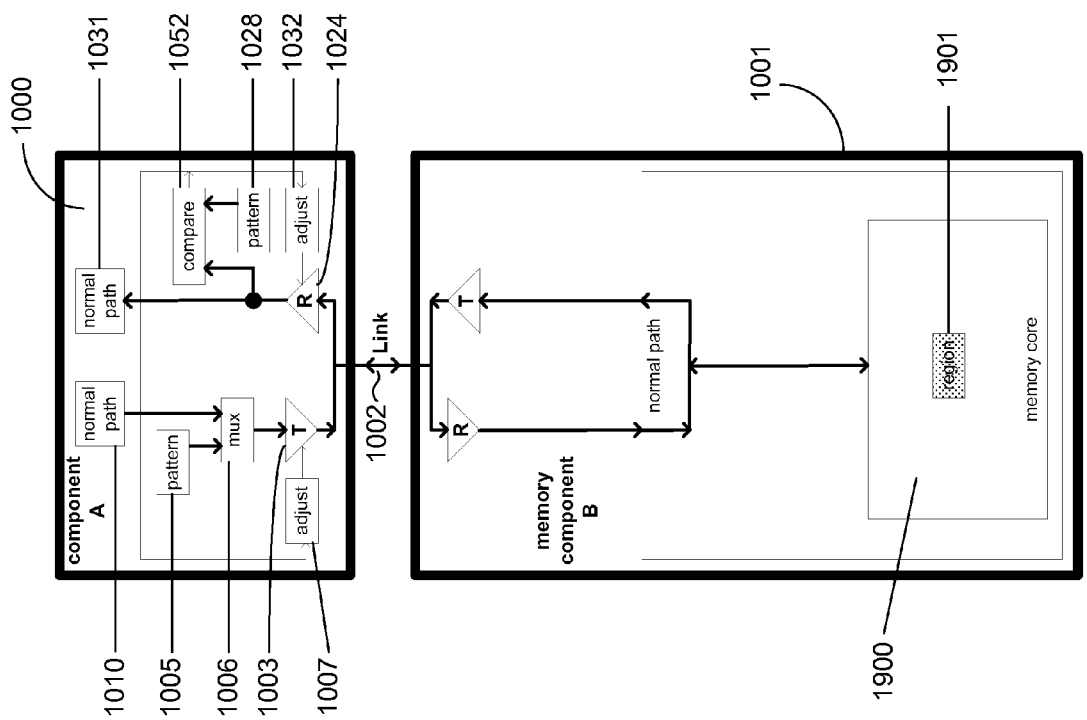
FIG. 19 illustrates a second embodiment of the invention including storage within a memory core used for storage of calibration patterns on one component sharing a bidirectional link.

FIG. 19 shows an option in which the storage block is implemented from the storage cells that are normally present in a memory core 1900. In this option, component 1001 is assumed to be a memory component. In this case, the storage area 1901, labeled "region", is reserved for receiving the pattern set from component 1000, and for retransmitting the pattern set back to component 1000. This storage area may only be used by the calibration process, and should not be used by any normal application process. If this storage area were used by an application process, it is possible that application information could be overwritten by the pattern set information and thereby lost. The benefit of this approach is that no additional storage needs to be added to component 1001 (and no special path from receiver to transmitter). The cost of this approach is that a hole is created in the address space of the memory component. Since most memory components contain a power-of-two number of storage cells, this may create a problem with some application processes, particularly if two or more memory components must create a contiguous memory address space (i.e. with no holes).

Figure 20:
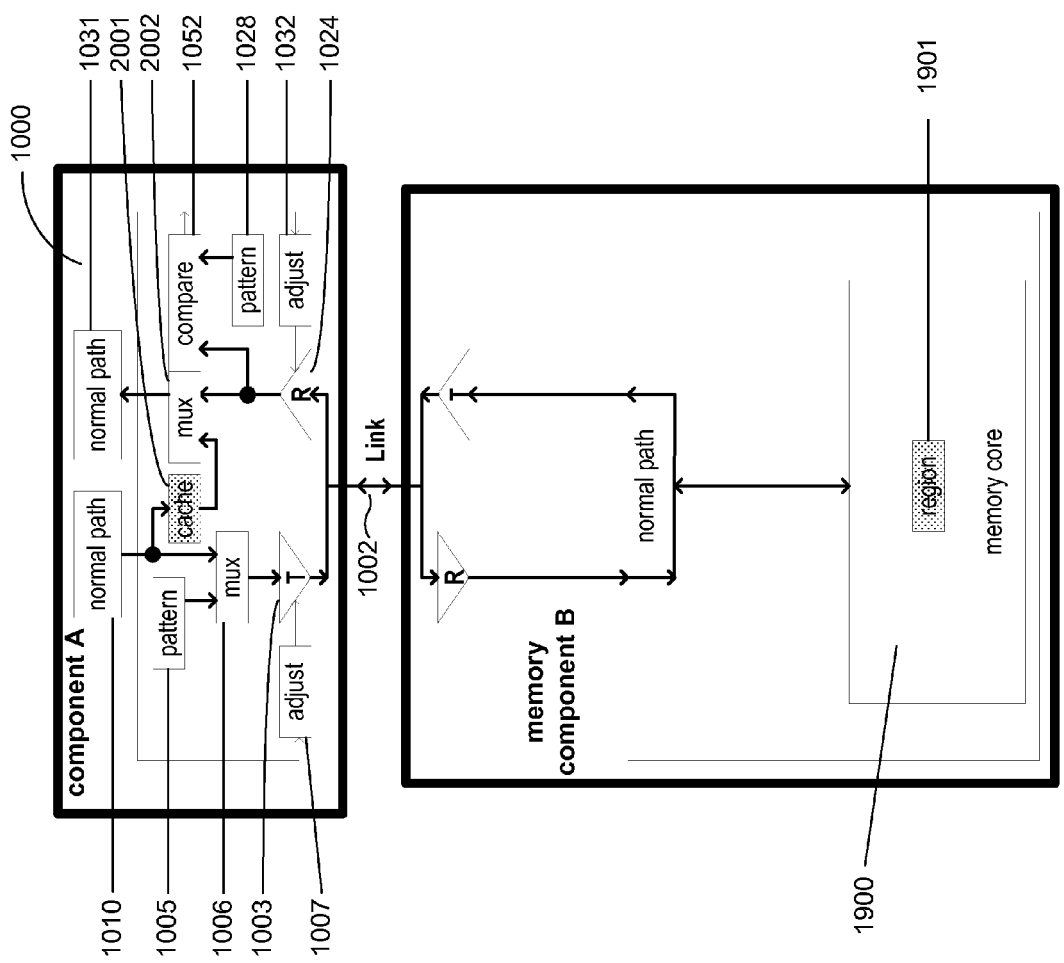
FIG. 20 illustrates a third embodiment of the invention including storage within a memory core for storage of calibration patterns on one component sharing a bidirectional link, and a cache supporting use of a region of the memory core for this purpose.

FIG. 20 shows an option in which the storage block is again implemented from the storage cells that are normally present in a memory core 1900. In this option, component B is assumed to be a memory component. In this case, the storage area 1901 labeled "region" is reserved for receiving the pattern set from component 1000, and for retransmitting the pattern set back to component 1000. This storage area may only be used by the calibration process, and should not be used by any normal application process. Unlike the option in FIG. 19, however, component 1000 adds a storage block 2001, labeled "cache", which emulates the storage capability of the storage area 1901 "region". When a write is performed to the "region" of storage area 1901, it is intercepted and redirected to the "cache" in storage 2001. Likewise, when a read is performed to the "region" of storage area 1901, the read is intercepted and redirected, returning read data from "cache" via mux 2002. In this way, the application processes see no hole in the memory address space. The benefit of this option is that no additional storage needs to be added to component 1001 (and no special path from receiver to transmitter). The cost of this approach is that a storage block 2001 "cache," with address comparison logic to determine when the application is attempting to access the region 1901, must be added to component 1000, as well as the control logic and "mux" block 2002 needed to intercept read and write commands for component 1001.

Figure 21:
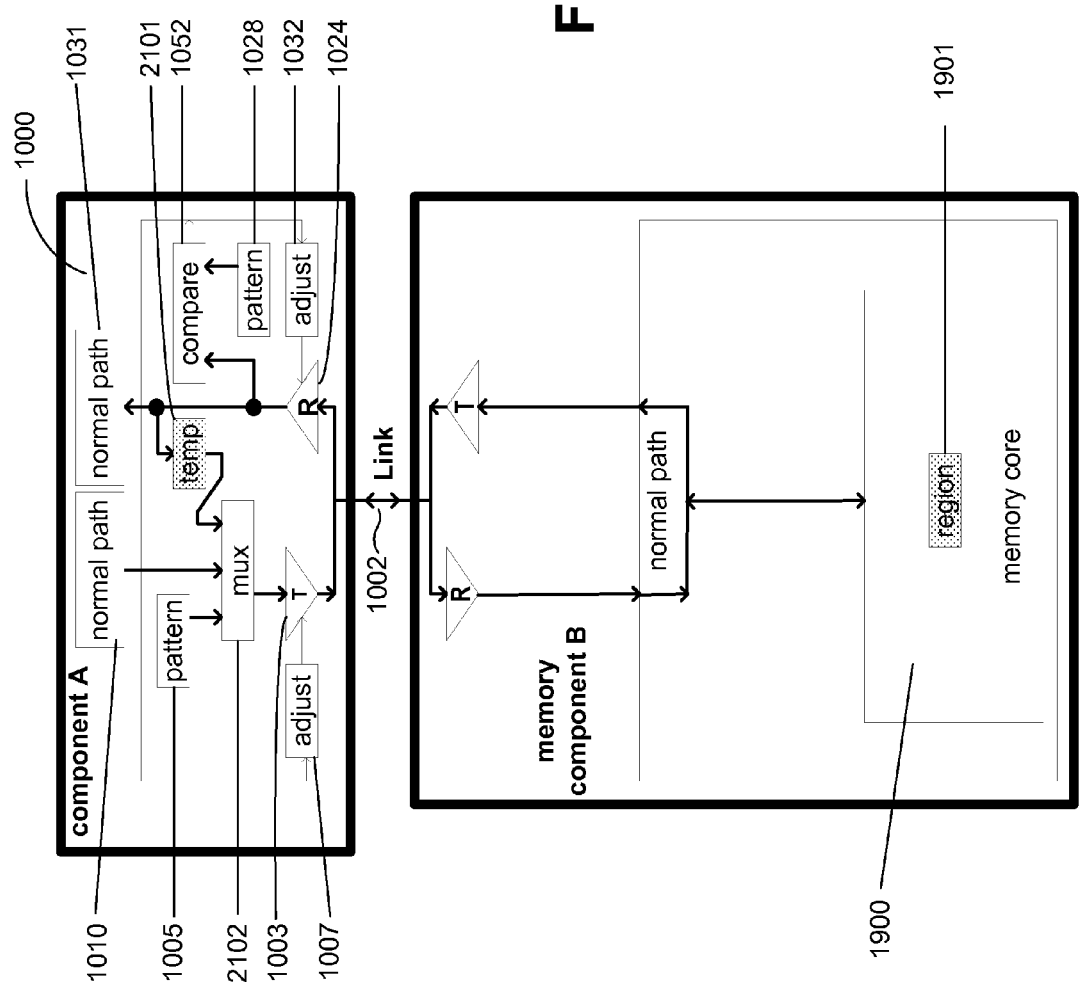
FIG. 21 illustrates a fourth embodiment of the invention including storage within a memory core for storage of calibration patterns on one component sharing a bidirectional link, and temporary storage supporting use of the region of the memory core for this purpose.

FIG. 21 shows an option in which the storage block is again implemented from the storage cells that are normally present in a memory core 1900. In this option, component 1001 is assumed to be a memory component. In this case, the storage area 1901 labeled "region" is used for receiving the pattern set from component 1000, and for retransmitting the pattern set back to component 1000. This storage area 1901 may be used by both the calibration process and by the application processes, however. In order to ensure that the application processes are not affected by the periodic calibration process, a temporary storage block 2101, labeled "temp", is provided in component 1000, along with a "mux" block 2102 for accessing it. When a calibration process starts, the contents of "region" are read and loaded into "temp" storage block 2101. The calibration process steps may now be carried out using the storage area 1901. When the calibration sequence has completed, the contents of "temp" storage block 2101 are accessed and written back to the "region" of storage area 1901, and the application process allowed to restart. Again, the application processes see no hole in the memory address space. The benefit of this option is that no additional storage needs to be added to component 1001 (and no special path from receiver to transmitter). The cost of this approach is that a storage block 2101 and the "mux" block 2102 must be added to component 1000. The calibration process becomes longer, since a read operation must be added to the beginning, and a write operation must be added to the end, supporting the use of the "temp" storage block 2101.

Figure 22:
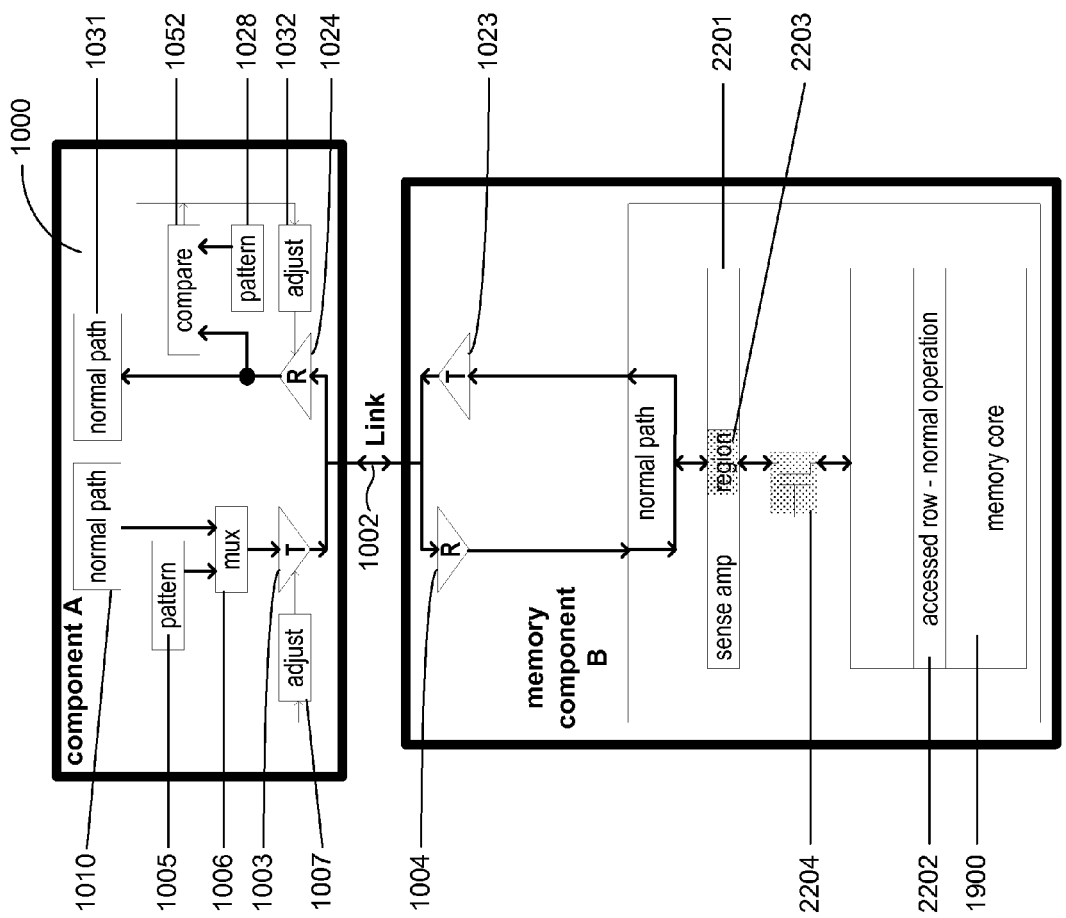
FIG. 22 illustrates a fifth embodiment of the invention including storage within sense amplifiers, which are used for storage of calibration patterns during calibration on one component sharing a bidirectional link.
Figure 23:
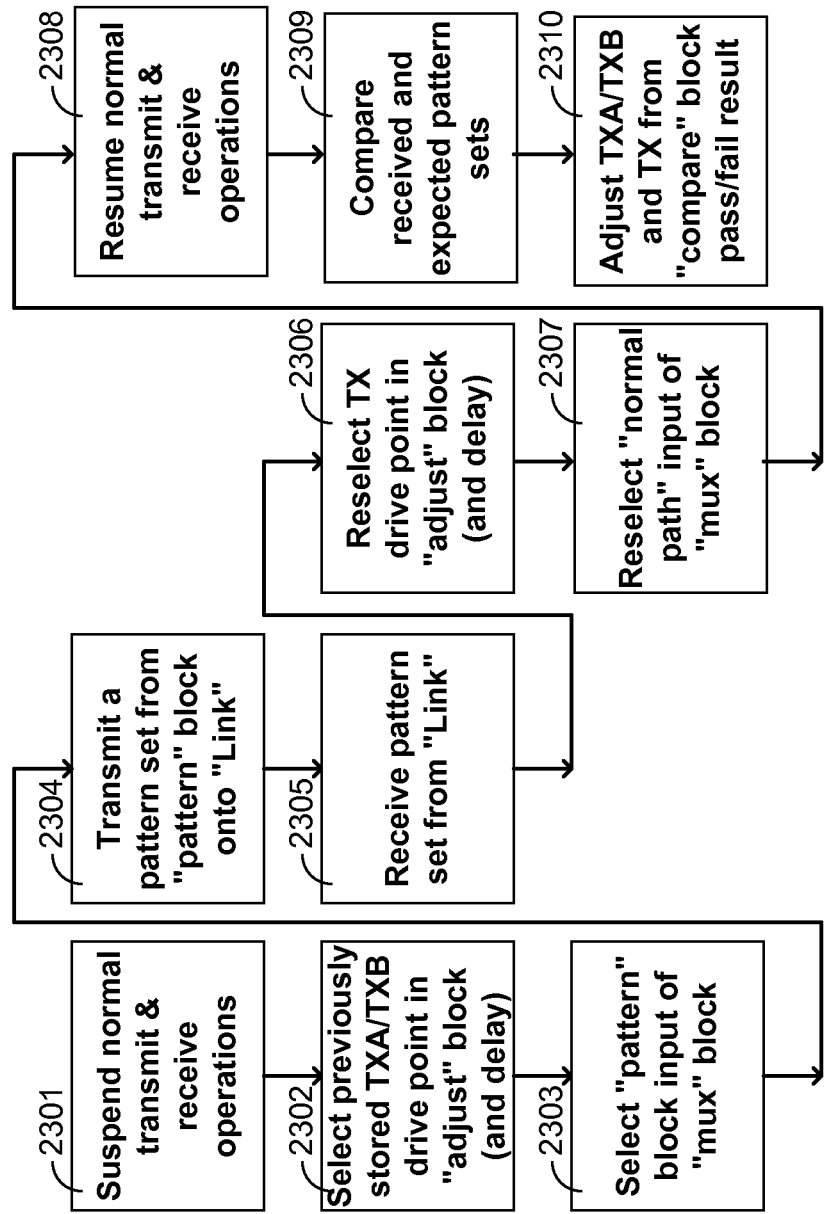
FIG. 23 is a flow chart illustrating calibration steps for a transmitter on a unidirectional link for a transmitter drive point, with re-ordered steps for improved throughput.
Figure 24:
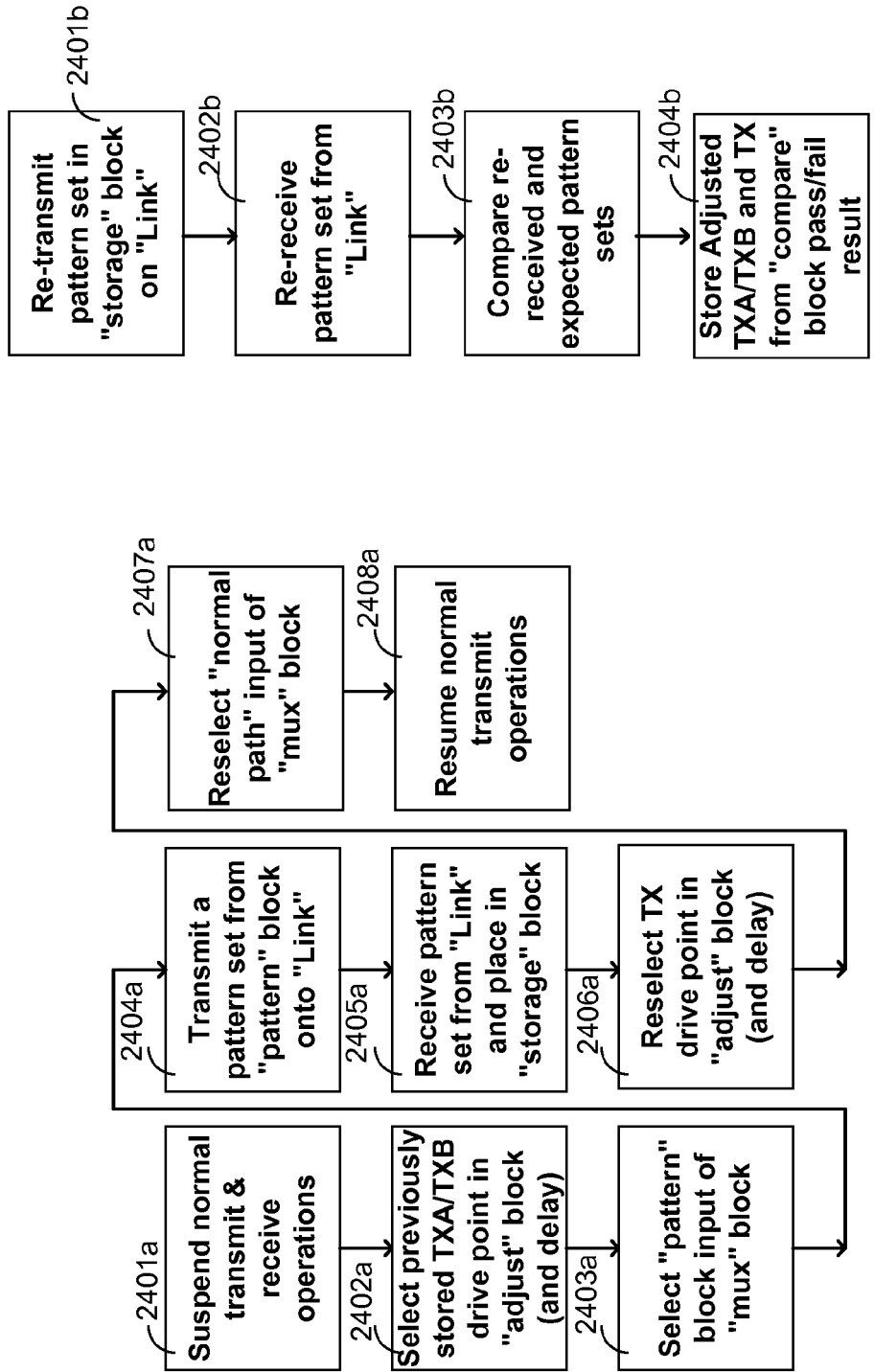
FIGS. 24A and 24B are flow charts illustrating calibration steps for a transmitter drive point for a bidirectional link, with re-ordered steps for improved throughput.

FIG. 22 shows an option in which the storage block is implemented from the latching sense amplifier circuit 2201 that is present in a memory component 1001. Latching sense amplifier circuit 2201 includes latches or other storage resources associated with sense amplifiers. Most memory components use such a latching sense amplifier circuit 2201 to access and hold a row 2202 of storage cells from the memory core 1900. Read operations are then directed to the sense amplifier which temporarily holds the contents of the row of storage cells. Write operations are directed to both the sense amplifier and to the row of storage cells so that the information held by these two storage structures is consistent. When another row of storage cells is to be accessed, the sense amplifier is precharged and reloaded with this different row.

When component 1001 is a memory component with such a latching sense amplifier circuit 2201, it is possible to modify its operation to permit a special mode of access for calibration. In this special mode, the sense amplifier may be written by the receiver circuit 1004 and may read to the transmitter circuit 1023 without first being loaded from a row 2202 of storage cells in the memory core 1900. This permits the storage resource of the sense amplifier circuits 2201 to be used to store received calibration patterns, or portions of received calibration patterns, in region 2203 (which may include less than an entire row in some embodiments) for calibration without affecting the contents of the memory core, which would affect the interrupted application process. This second access mode would require a gating circuit 2204 between the memory core and the sense amplifier, which could be disabled during the calibration process. There is typically such a gating circuit 2204 in most memory components.

A benefit of this option is that no additional storage needs to be added to component 1001 (and no special path from receiver to transmitter). The cost of this approach is that a modification must be made to critical circuits in the core of a memory component.

Reordering of Calibration Steps to Improve Throughput

The individual steps that are shown in the calibration processes described above do not necessarily have to be done in the order shown. In fact, if some reordering is done, the overhead of the calibration process can be reduced, improving the effective signaling bandwidth of the system and reducing the worst case delay seen by latency—sensitive operations.

For example, in the case of the calibration process for the transmitter shown in FIG. 6, it is not necessary to perform the evaluation steps and the update steps (compare 606 and adjust 607) in sequence as shown. Instead, the transmitter calibration process may be performed in the following manner:

(Step 2301) Suspend normal transmit and receive operations, by completing transactions in progress and preventing new ones from beginning, or by interrupting transactions that are in progress.

(Step 2302) Control the "adjust" logic so the transmitter uses a calibrate (TXA/TXB) drive-timing-point according to the stored results of the previous comparison.

(Step 2303) Control the "adjust" logic so that the pattern block is coupled to the transmitter.

(Step 2304) A pattern sequence is read or created from the pattern block and is transmitted onto the interconnect using the selected calibrate drive-timing-point.

(Step 2305) The pattern sequence is received using the normal (RX) sample-timing-point.

(Step 2306) Control the "adjust" logic so the transmitter uses a normal (TX) drive-timing-point.

(Step 2307) Control the "adjust" logic so that the "normal path" to the transmitter is enabled.

(Step 2308) Resume normal transmit and receive operations.

(Step 2309) The received pattern sequence is compared to the expected pattern sequence from the "pattern" block.

(Step 2310) The calibrate drive-timing-point (TXA/TXB, TX) is adjusted according to the results of the comparison.

In the modified sequence, normal transmit and receive operations may be restarted earlier. This is possible because the comparison results are saved and used to adjust the timing point during the next calibration process.

A more significant saving in overhead is possible in the system of FIG. 13, by changing the order of steps in the process of FIG. 14, for example. It is possible to separate the evaluation and update steps as previously described. However, it is also possible to perform receive operations with the first component while its transmitter is changing the drive-timing-point between the normal and calibrate values. The periodic calibration process could become:

(Step 2401a) Suspend normal transmit operations, by completing transactions in progress and preventing new ones from beginning, or by interrupting transactions that are in progress (Step 2402a) Control the "adjust" logic so the transmitter uses a calibrate (TXA/TXB) drive-timing-point according to the stored results of the previous comparison.

(Step 2403a) Control the "adjust" logic that the pattern block is coupled to the transmitter.

(Step 2404a) A pattern sequence is created from the "pattern" block and is transmitted onto the interconnect using the selected calibrate drive-timing-point.

(Step 2405a) The pattern sequence is received in the second component and placed in storage.

(Step 2406a) Control the "adjust" logic so the transmitter uses a normal (TX) drive-timing-point.

(Step 2407a) Control the "adjust" logic so that the "normal path" to the transmitter is enabled.

(Step 2408a) Resume normal transmit operations.

Note that receive operations could continue during this process except when the calibration pattern is actually being transmitted on the interconnect. In particular, the component could receive while its transmitter is changing the drive-timing-point between the normal and calibrate values. The second set of steps for the calibration process would consist of:

(Step 2401b) The pattern sequence in storage is transmitted onto the interconnect by the second component.

(Step 2402b) The pattern sequence is received using the normal (RX) sample-timing-point.

(Step 2403b) The received pattern sequence is compared to the expected pattern sequence from the "pattern" block.

(Step 2404b) The calibrate drive-timing-point (TXA/TXB, TX) is adjusted according to the results of the comparison.

Note that normal transmit and receive operations could continue during this process except when the calibration pattern is actually being received from the interconnect.

If reordering and overlapping of calibration steps is done, the overhead of the calibration process can be reduced, improving the effective signaling bandwidth of the system and reducing the worst case delay seen by latency-sensitive operations.

The reduction in overhead can also permit the periodic calibration process to be executed at a more frequent rate. The benefit is that this will compensate for sources of timing drift that change more rapidly. This will permit more of the bit time to be used for the transmitter drive time variation and the receiver sampling window, and less of the bit time will be needed for timing drift within the system.

Figure 25:
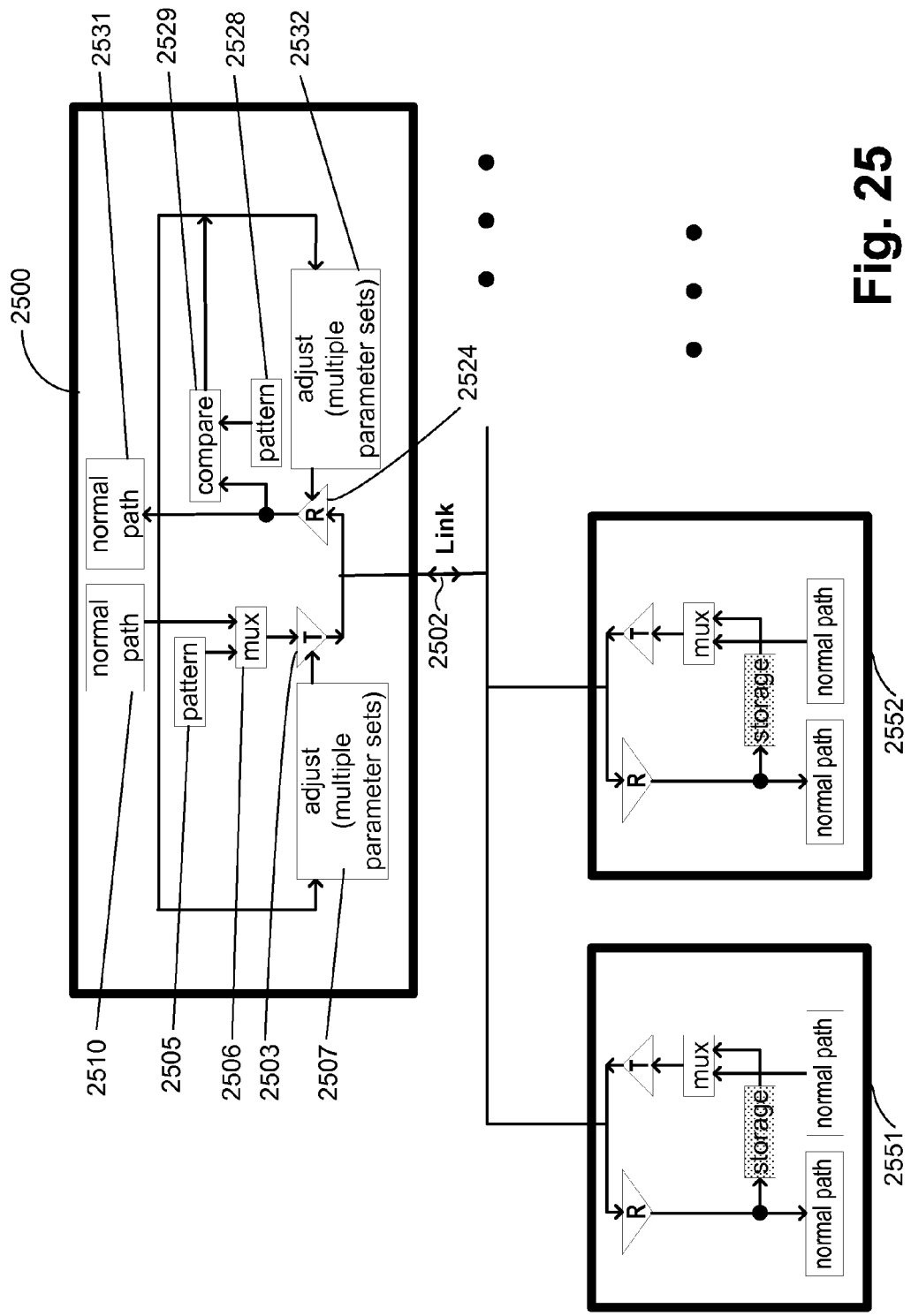
FIG. 25 illustrates an embodiment of the present invention where a transmitter drive point and a receiver sample point of one component on a bidirectional link are adjustable with a plurality of parameter sets, and wherein the bidirectional link is coupled to a plurality of other components corresponding to the plurality of parameter sets.

FIG. 25 illustrates an example like that of FIG. 13, with the exception that the point to point bidirectional link of FIG. 13 is replaced with a multidrop link, coupling component 2500 to a plurality of components 2551, 2552. The multidrop link configuration can be applied in other configurations. In the representative example shown in FIG. 25, a first bidirectional component 2500 and a plurality of other bidirectional components 2551, 2552 are connected in a point to multi-point configuration, or multipoint to multipoint configuration, with an interconnection medium referred to as Link 2502. Normal path 2510 acts as a source of data signals for normal operation of component 2500 during transmit operations. Normal path 2531 acts as a destination of data signals for component 2500, during normal receive operations. The calibration operations are interleaved, and re-ordered, in this embodiment with normal communications, as described above to improve throughput and utilization of the communication medium The first bidirectional component 2500 includes a block 2505 labeled "pattern", which can consist of pattern storage or pattern generation circuitry, and which is used as a source of transmit calibration patterns. A multiplexer block 2506 labeled "mux," implemented for example using a logical layer or physical layer switch, enables the transmit calibration pattern set to be driven onto the link by the transmitter circuit 2503. The transmitter drive point can be adjusted by the block 2507 labeled "adjust". In this embodiment, the adjust block 2507 includes storage for multiple parameter sets which are applied depending on the one of the other components 2551, 2552, . . . on the link to which the transmission is being sent. Component 2500 also has support for calibrating receiver 2524, including a block 2528 labeled "pattern", which can consist of pattern storage or pattern generation circuitry, and which is used as a source of expected patterns for comparison with received patterns. A block 2529 labeled "compare" enables the received pattern set to be compared to the expected pattern set, and causes an adjustment to be made to either the transmitter or receiver. The receiver sample point can be adjusted by the block 2532 labeled "adjust". In this embodiment, the adjust block 2507 includes storage for multiple parameter sets which are applied depending on the one of the other components 2551, 2552, . . . on the link from which the communication is being received. In the first component 2500, the compare block 2529 is used for analysis of both transmit and receive calibration operations, and is coupled to both the adjust block 2507 for the transmitter, and adjust block 2532 for the receiver. In the example of FIG. 25, the receiver sample point and transmitter drive point of the first bidirectional component 2500 are adjustable. The other components 2551, 2552, . . . are implemented as described with reference to FIG. 13 without adjustment resources, in this example, and not described here. In alternative embodiments, the components 2551, 2552, . . . on the link may be provided with adjustment and calibration resources, as described for other embodiments above.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operation of an integrated circuit component, the method used for calibrating a parameter associated with transmission of data on a communication channel, the method comprising:

transmitting a calibration sequence used to establish an operation value that represents the parameter;

transmitting data in accordance with the operation value;

determining adjustment information for the parameter, interspersed with said transmitting data over the communication channel;

adjusting the operation value for the parameter using said adjustment information.

2. The method of claim 1, wherein the adjustment information indicates drift of the parameter during operation of the integrated circuit component.

3. The method of claim 1, including storing requests to transmit data over the communication channel during said determining.

4. The method of claim 1, comprising using a portion of addressable memory space of the integrated circuit component as a storage block to store patterns received in the calibration sequence.

5. The method of claim 1, wherein said determining includes using second calibration sequences a plurality of times during operation of the integrated circuit component, and producing a pass or fail determination during each use of the second calibration sequences.

6. The method of claim 5, comprising receiving calibration patterns during said second calibration sequences, and using a portion of addressable memory space of the integrated circuit component as a storage block to store patterns received in the second calibration sequences.

7. The method of claim 5, including reserving said portion of the addressable memory space for use as the storage block, and storing requests to communicate data over the communication channel to be stored in said portion of the addressable memory space in a cache memory during said second calibration sequences.

8. The method of claim 5, including reserving said portion of the addressable memory space for use as the storage block, and while using one of the second calibration sequences, storing data from said storage block into temporary storage, storing data of said one of the second calibration sequences into the storage block, and after completion of said one of the second calibration sequences, copying the data from the temporary storage into the storage block.

9. The method of claim 6, wherein said determining includes using second calibration sequences N times during operation of the integrated circuit component, and producing a pass or fail determination during each use of the second calibration sequences; and after the Nth second calibration sequence, decrementing a drift value for the parameter if there is less than a predetermined number of pass determinations, and incrementing the drift value if there is more than a predetermined number of fail determinations.

10. An integrated circuit, comprising:

an interface for a communication channel;

logic to apply a parameter associated with transmission of data on the communication channel;

logic to process a calibration sequence to establish an operation value that represents the parameter, and to transmit or receive data in accordance with the operation value;

logic to determine adjustment information for the parameter, interspersed with said transmission or reception of data on the communication channel; and logic to adjust the operation value for the parameter using said adjustment information.

11. The integrated circuit of claim 10, wherein the adjustment information indicates drift of the parameter during operation of the integrated circuit.

12. The integrated circuit of claim 10, including logic to store requests to transmit data over the communication channel while determining the adjustment information.

13. The integrated circuit of claim 10, comprising addressable memory space, and logic to use portion of the addressable memory space as a storage block to store patterns received in the calibration sequence.

14. The integrated circuit of claim 10, wherein said logic to determine adjustment information uses second calibration sequences a plurality of times during operation of the integrated circuit, and produces a pass or fail determination during each use of the second calibration sequences.

15. The integrated circuit of claim 14, comprising logic to receive calibration patterns during said second calibration sequences, and use a portion of addressable memory space of the integrated circuit component as a storage block to store patterns received in the second calibration sequences.

16. The integrated circuit of claim 14, comprising a cache memory, and logic to reserve said portion of the addressable memory space for use as the storage block, and store requests to communicate data over the communication channel to be stored in said portion of the addressable memory space in the cache memory during said second calibration sequences.

17. The integrated circuit of claim 14, including logic to reserve said portion of the addressable memory space for use as the storage block, and while using one of the second calibration sequences, to store data from said storage block into temporary storage, store data of said one of the second calibration sequences into the storage block, and after completion of said one of the second calibration sequences, to copy the data from the temporary storage into the storage block.

18. The integrated circuit of claim 10, wherein said logic to determine adjustment information uses second calibration sequences N times during operation of the integrated circuit, and produces a pass or fail determination during each use of the second calibration sequences; and after the Nth second calibration sequence, decrements a drift value for the parameter if there is less than a predetermined number of pass determinations, and increments the drift value if there is more than a predetermined number of fail determinations.

* * * * *